United States Patent
Lee et al.

(10) Patent No.: US 12,334,483 B2
(45) Date of Patent: Jun. 17, 2025

(54) LIGHT EMITTING DEVICE FOR DISPLAY HAVING LED STACKS

(71) Applicant: SEOUL VIOSYS CO., LTD., Ansan-si (KR)

(72) Inventors: Seom Geun Lee, Ansan-si (KR); Chan Seob Shin, Ansan-si (KR); Ho Joon Lee, Ansan-si (KR); Seong Kyu Jang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 492 days.

(21) Appl. No.: 17/826,106

(22) Filed: May 26, 2022

(65) Prior Publication Data

US 2022/0285329 A1    Sep. 8, 2022

Related U.S. Application Data

(63) Continuation of application No. 16/782,594, filed on Feb. 5, 2020, now Pat. No. 11,362,073.

(Continued)

(51) Int. Cl.
*H01L 25/13* (2006.01)
*H10H 20/813* (2025.01)
(Continued)

(52) U.S. Cl.
CPC .......... *H01L 25/13* (2013.01); *H10H 20/813* (2025.01); *H10H 20/833* (2025.01); *H10H 20/857* (2025.01)

(58) Field of Classification Search
CPC ......... H01L 25/13; H01L 33/08; H01L 33/42; H01L 33/62
(Continued)

(56) References Cited

U.S. PATENT DOCUMENTS 8,975,650 B2 * 3/2015 Lee .................. H01L 33/38
                                                         257/E33.068
9,076,929 B2    7/2015 Katsuno et al.
(Continued)

FOREIGN PATENT DOCUMENTS

CN    104425540 A  *  3/2015  ............... B60Q 1/04
CN    109192821 A  *  1/2019  ........... H01L 27/156
(Continued)

OTHER PUBLICATIONS

Non-Final Office Action issued Oct. 15, 2021, in U.S. Appl. No. 16/782,594.
(Continued)

*Primary Examiner* — Phuc T Dang
(74) *Attorney, Agent, or Firm* — Oblon, McClelland, Maier & Neustadt, L.L.P.

(57) ABSTRACT

A light emitting device for a display including a circuit board, a plurality of light emitting units arranged on the circuit board, each light emitting unit comprising a first LED stack including a first conductivity type semiconductor layer, a second conductivity type semiconductor layer, a first electrode disposed on the first conductivity type semiconductor layer, and a second electrode disposed on the second conductivity type semiconductor layer, a plurality of bump pads disposed between the plurality of light emitting units and the circuit board, and a bonding layer disposed between the second electrode and the circuit board, in which the second electrode has a side surface recessed inwardly with respect to a side surface of the light emitting unit to define a recessed portion, and the bonding layer is filled in the recessed portion.

19 Claims, 47 Drawing Sheets

Related U.S. Application Data

(60) Provisional application No. 62/802,784, filed on Feb. 8, 2019.

(51) Int. Cl.
  *H10H 20/833* (2025.01)
  *H10H 20/857* (2025.01)

(58) Field of Classification Search
  USPC .......................................................... 257/89
  See application file for complete search history.

(56) References Cited

U.S. PATENT DOCUMENTS

| | | | |
|---|---|---|---|
| 10,475,957 | B2 | 11/2019 | Cha et al. |
| 11,362,073 | B2 | 6/2022 | Lee et al. |
| 2009/0078955 | A1 | 3/2009 | Fan et al. |
| 2009/0272989 | A1 | 11/2009 | Shum et al. |
| 2014/0026952 | A1 | 1/2014 | Kim et al. |
| 2015/0001561 | A1 | 1/2015 | Katsuno et al. |
| 2017/0288093 | A1 | 10/2017 | Cha et al. |
| 2018/0350872 | A1* | 12/2018 | Choi ................. H01L 33/62 |
| 2019/0229098 | A1* | 7/2019 | Hsieh ................ H01L 33/505 |

FOREIGN PATENT DOCUMENTS

| | | |
|---|---|---|
| JP | 2015-12244 A | 1/2015 |
| JP | 2018-121059 A | 8/2018 |
| KR | 10-2012-0087039 | 8/2012 |
| KR | 101354981 B1 | 1/2014 |
| KR | 10-2015-0003676 | 1/2015 |
| KR | 101625122 B1 | 5/2016 |
| KR | 10-2017-0115142 | 10/2017 |
| KR | 10-2019-0001050 | 1/2019 |
| KR | 10-2019-0003162 | 1/2019 |

OTHER PUBLICATIONS

Notice of Allowance dated Feb. 15, 2022, in U.S. Appl. No. 16/782,594.

Office Action dated Apr. 11, 2023 from the Indian Patent Office for Indian Patent Application No. 202117036821.

Office Action issued Jan. 9, 2024, in corresponding Japanese Patent Application No. 2021-545853 (with English Translation), 6 pages.

United States Office Action issued Oct. 17, 2024 in United States U.S. Appl. No. 17/878,024, 18 pages.

* cited by examiner

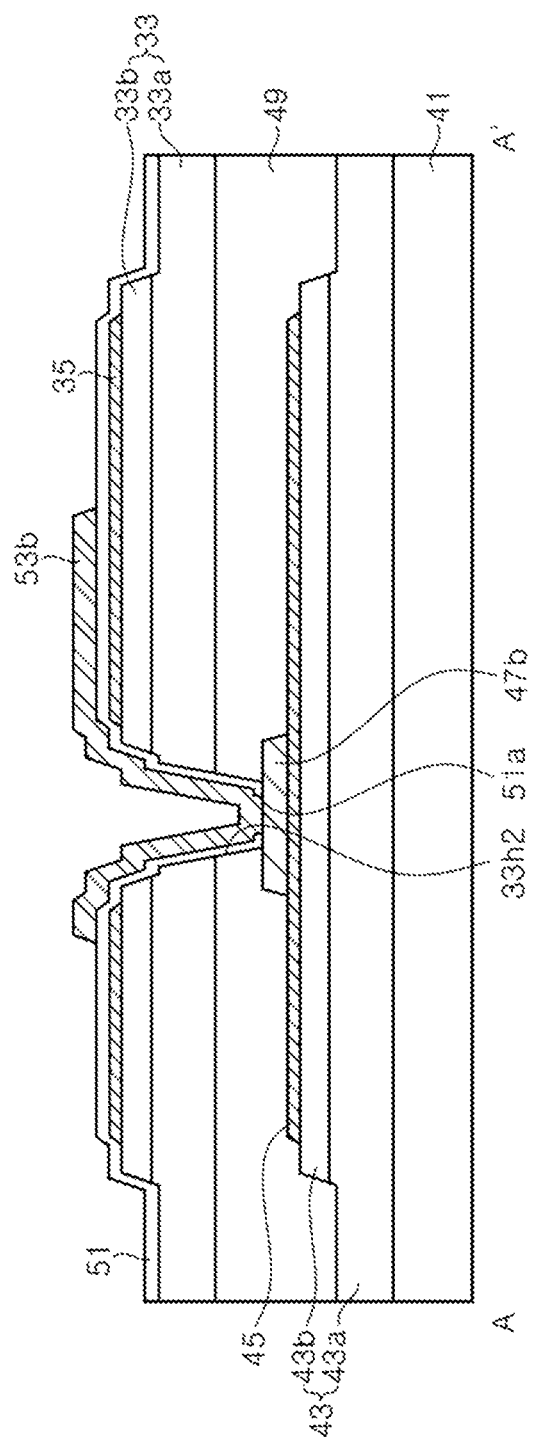

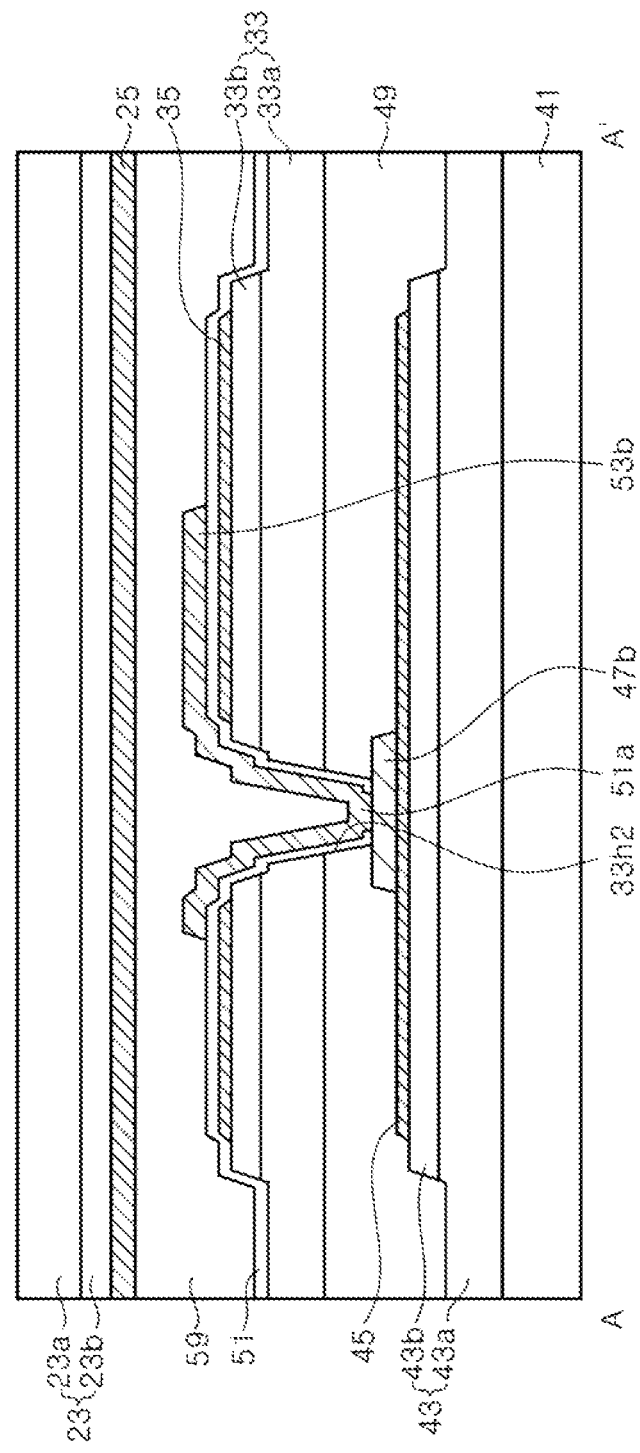

ND DEVICE FOR DISPLAY
LIGHT EMITTING DEVICE FOR DISPLAY HAVING LED STACKS

CROSS-REFERENCE TO RELATED APPLICATION

This application is a Continuation of U.S. application Ser. No. 16/782,594, filed Feb. 5, 2020 (now U.S. Pat. No. 11,362,073), which claims priority from and the benefit of U.S. Provisional Application No. 62/802,784, filed on Feb. 8, 2019, each of which is hereby incorporated by reference for all purposes as if fully set forth herein.

BACKGROUND

Field

Exemplary embodiments relate to a light emitting device for a display and a display apparatus, and, more particularly, to a light emitting device having a stack structure of a plurality of LEDs for a display, and a display apparatus including the same.

Discussion of the Background

As an inorganic light source, light emitting diodes have been used in various technical fields, such as displays, vehicular lamps, general lighting, and the like. With various advantages of the light emitting diodes, such as longer lifespan, lower power consumption, and faster response, than existing light sources, light emitting diodes have been replacing the existing light sources.

Light emitting diodes have been generally used as backlight light sources in display apparatuses. However, LED displays that directly realize images using the light emitting diodes have been recently developed.

In general, a display apparatus displays various colors through mixture of blue, green, and red light. In order to realize various images, the display apparatus includes a plurality of pixels, each including sub-pixels corresponding to one of blue, green, and red light. As such, a color of a certain pixel is typically determined based on the colors of the sub-pixels, so that images can be realized through the combination of such pixels.

Since LEDs can emit various colors depending upon materials thereof, individual LED chips emitting blue, green and red light may be arranged on a two-dimensional plane to provide a display apparatus. However, when one LED chip is provided to each sub-pixel, the number of LED chips may be increased, which may require excessive time for a mounting process during manufacture.

Moreover, since the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

The above information disclosed in this Background section is only for understanding of the background of the inventive concepts, and, therefore, it may contain information that does not constitute prior art.

SUMMARY

Exemplary embodiments provide a light emitting device for a display that is capable of increasing an area of each sub-pixel in a restricted pixel area and a display apparatus including the same.

Exemplary embodiments also provide a light emitting device for a display that is capable of reducing a time associated with a mounting process and a display apparatus including the same.

Exemplary embodiments further provide a light emitting device for a display that is capable of increasing the production yield and a display apparatus including the same.

Additional features of the inventive concepts will be set forth in the description which follows, and in part will be apparent from the description, or may be learned by practice of the inventive concepts.

A light emitting device for a display according to an exemplary embodiment includes: a first LED stack; a second LED stack disposed under the first LED stack; a third LED stack disposed under the second LED stack; a first transparent electrode interposed between the first LED stack and the second LED stack, and being in ohmic contact with a lower surface of the first LED stack; a second transparent electrode interposed between the first LED stack and the second LED stack, and being in ohmic contact with an upper surface of the second LED stack; a third transparent electrode interposed between the second LED stack and the third LED stack, and being in ohmic contact with an upper surface of the third LED stack; a first electrode pad disposed on a first conductivity type semiconductor layer of the third LED stack; a lower second electrode pad disposed on the third transparent electrode; and bump pads disposed on the first LED stack, in which each of the first to third LED stacks includes a first conductivity type semiconductor layer, an active layer, and a second conductivity type semiconductor layer, the bump pads include first, second, and third bump pads and a common bump pad, in which the common bump pad is commonly electrically connected to the first to third LED stacks, respectively, the first to third bump pads are electrically connected to the first to third LED stacks, respectively, and an upper surface of the first electrode pad is located at substantially the same elevation as that of the lower second electrode pad.

A light emitting device for a display according to another exemplary embodiment includes: a first LED stack; a second LED stack disposed under the first LED stack; a third LED stack disposed under the second LED stack; a first transparent electrode interposed between the first LED stack and the second LED stack, and being in ohmic contact with a lower surface of the first LED stack; a second transparent electrode interposed between the first LED stack and the second LED stack, and being in ohmic contact with an upper surface of the second LED stack; a third transparent electrode interposed between the second LED stack and the third LED stack, and being in ohmic contact with an upper surface of the third LED stack; bump pads disposed on the first LED stack, in which each of the first to third LED stacks includes a first conductivity type semiconductor layer, an active layer, and a second conductivity type semiconductor layer, and at least one of the first to third transparent electrodes is recessed from an edge of the second conductivity type semiconductor layer of the first to third LED stacks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concepts.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C and 13D are schematic plan views and cross-sectional views illustrating a method of manufacturing a light emitting device for a display according to an exemplary embodiment.

DETAILED DESCRIPTION

Figure 1:
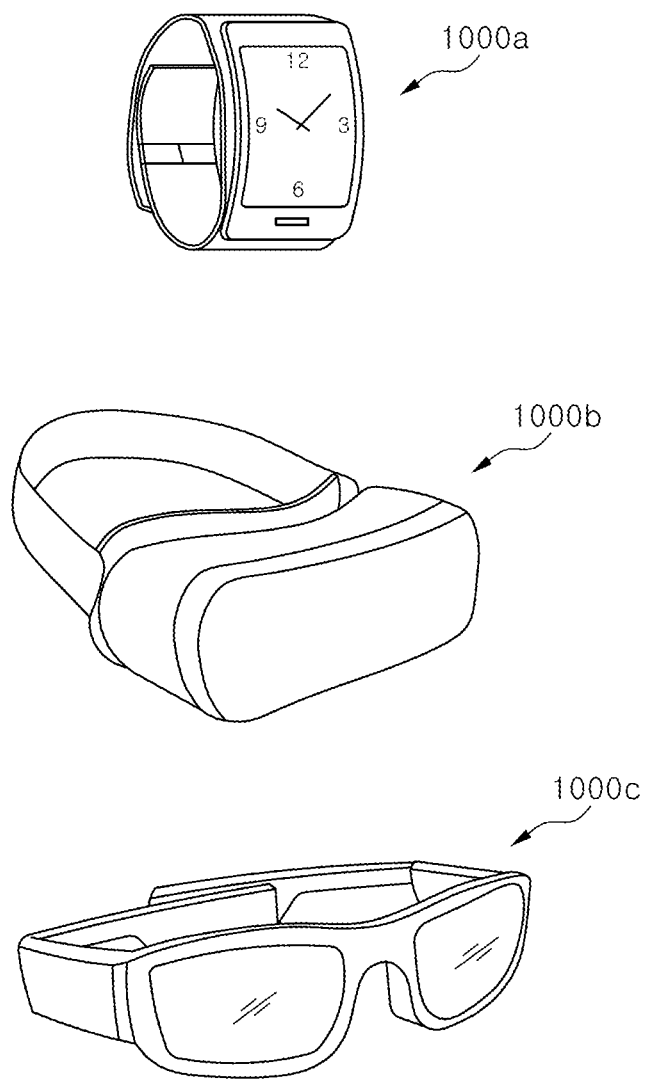
FIG. 1 shows schematic perspective views illustrating display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting device for a display according to an exemplary embodiment includes: a first LED stack; a second LED stack disposed under the first LED stack; a third LED stack disposed under the second LED stack; a first transparent electrode interposed between the first LED stack and the second LED stack, and being in ohmic contact with a lower surface of the first LED stack; a second transparent electrode interposed between the first LED stack and the second LED stack, and being in ohmic contact with an upper surface of the second LED stack; a third transparent electrode interposed between the second LED stack and the third LED stack, and being in ohmic contact with an upper surface of the third LED stack; an n-electrode pad disposed on a first conductivity type semiconductor layer of the third LED stack; a lower p-electrode pad disposed on the third transparent electrode; and bump pads disposed on the first LED stack, in which each of the first to third LED stacks includes a first conductivity type semiconductor layer, an active layer and a second conductivity type semiconductor layer, the bump pads include first to third bump pads and common bump pads, in which the common bump pad is commonly electrically connected to the first to third LED stacks, the first to third bump pads are electrically connected to the first to third LED stacks, respectively, and an upper surface of the n-electrode pad is located at substantially the same elevation as that of the lower p-electrode pad.

Hereinafter, the second LED stack is described as being disposed under the first LED stack, and the third LED stack is described as being disposed under the second LED stack, however, in some exemplary embodiments, the light emitting device may be flip-bonded. In this case, upper and lower positions of these first to third LED stacks may be reversed.

When the first to third LED stacks are stacked one above another, the light emitting device may have an increased luminous area of each sub-pixel without increasing a pixel area.

Furthermore, the upper surface of the n-electrode pad is set to be located at substantially the same elevation as that of the lower p-electrode pad, and thus, damage to any one of these pads may be prevented.

The first LED stack may emit light having a longer wavelength than that emitted from the second LED stack, and the second LED stack may emit light having a longer wavelength than that emitted from the third LED stack. For example, the first, second, and third LED stacks may emit red light, green light, and blue light, respectively. In another exemplary embodiment, the first LED stack may emit light having a longer wavelength than that emitted from the third LED stack, and the second LED stack may emit light having a shorter wavelength than that emitted from the third LED stack. For example, the first, second and third LED stacks may emit red light, blue light, and green light, respectively.

The first to third LED stacks may be independently driven, light generated from the first LED stack may be emitted to the outside through the second LED stack and the third LED stack, and light generated from the second LED stack may be emitted to the outside through the third LED stack.

Any one of the first to third transparent electrodes may be formed of a material different from the remaining transparent electrodes. For example, the first transparent electrode may be formed of indium-tin-oxide (ITO), and the second and third transparent electrodes may be formed of ZnO.

Each of the first to third transparent electrodes may contact the second conductivity type semiconductor layer, and the second and third transparent electrodes may be recessed to have a smaller area than that of the second conductivity type semiconductor layer of the second LED stack and that of the second conductivity type semiconductor layer of the third LED stack, respectively.

In this manner, as the second and third transparent electrodes are recessed, they may be prevented from being damaged by etching gas during the manufacturing process.

Further, the common bump pad may be commonly electrically connected to first conductivity type semiconductor layers of the first to third LED stacks, in which the first to third bump pads may be electrically connected to second conductivity type semiconductor layers of first to third LED stacks, respectively. However, the inventive concepts are not limited thereto, the common bump pad may be commonly electrically connected to the second conductivity type semiconductor layers of the first to third LED stacks, and the first to third bump pads may be electrically connected to the first conductivity type semiconductor layers of the third LED stacks, respectively.

The light emitting device may further include an insulation layer covering side surfaces of the first to third LED stacks, in which the side surfaces of the first to third LED stacks and a side surface of the first transparent electrode may be in contact with the insulation layer, and side surfaces of the second and third transparent electrodes may be spaced apart from the insulation layer.

Side surfaces of the light emitting device may be inclined at a range of about 75 degrees to about 90 degrees with respect to the upper surface of the third LED stack. The inclination angle of the side surfaces of the light emitting device is set to about 75 degrees or more, and thus, a luminous area of the first LED stack may be secured.

The light emitting device may further include a first bonding layer interposed between the second LED stack and the third LED stack; and a second bonding layer interposed between the first LED stack and the second LED stack.

The light emitting device may further include lower through holes passing through the second LED stack and the first bonding layer to expose the n-electrode pad and the lower p-electrode pad, respectively; a lower common connector connected to the n-electrode pad; and a lower p-connector connected to the lower p-electrode pad, in which the lower common connector may be electrically connected to the first conductivity type semiconductor layer of the LED stack, and connected to the n-electrode pad exposed through the lower through hole, and the lower p-connector may be electrically connected to the lower p-electrode pad exposed through the lower through hole.

The light emitting device may further include an upper p-electrode pad which is disposed on the second transparent electrode and electrically connected to the second conductivity type semiconductor layer of the second LED stack.

The light emitting device may further include a through hole passing through the first LED stack to expose the first transparent electrode; through holes passing through the first LED stack, the first transparent electrode and the second bonding layer to expose the upper p-electrode pad, the lower p-connector, and the lower common connector, respectively; and first to third upper connectors and an upper common connector disposed on the first LED stack, and electrically connected to the first transparent electrode, the upper p-electrode pad, the lower p-connector, and the lower common connector through holes passing through the first LED stack, in which the bump pads may be disposed on the first to third upper connectors and the upper common connector, respectively.

The bump pads may be located on flat portions of the first to third upper connectors and the upper common connector, respectively.

The light emitting device may further include an upper insulation layer covering the first to third upper connectors and the upper common connector, in which the upper insulation layer may have openings exposing the first to third upper connectors and the upper common connector, and each of the bump pads may be disposed in the openings.

The light emitting device may further include an intermediate insulation layer disposed between the first LED stack and the upper connectors, in which the intermediate insulation layer may cover a side surface of the light emitting device and a sidewall of the through hole passing through the first LED stack, and may include openings exposing the first transparent electrode, the upper p-electrode pad, the lower p-connector, and the lower common connector.

The first to third LED stacks may be stacks separated from a growth substrate. As such, the light emitting device does not have the growth substrate.

A light emitting device for a display according to another exemplary embodiment includes: a first LED stack; a second LED stack disposed under the first LED stack; a third LED stack disposed under the second LED stack; a first transparent electrode interposed between the first LED stack and the second LED stack, and being in ohmic contact with a lower surface of the first LED stack; a second transparent electrode interposed between the first LED stack and the second LED stack, and being in ohmic contact with an upper surface of the second LED stack; a third transparent electrode interposed between the second LED stack and the third LED stack, and being in ohmic contact with an upper surface of the third LED stack; bump pads disposed on the first LED stack, in which each of the first to third LED stacks may include a first conductivity type semiconductor layer, an active layer, and a second conductivity type semiconductor layer, and at least one of the first to third transparent electrodes may be recessed from an edge of the second conductivity type semiconductor layer of the first to third LED stacks.

The light emitting device may further include an n-electrode pad disposed on the first conductivity type semiconductor layer of the third LED stack; a lower p-electrode pad disposed on the third transparent electrode, in which an upper surface of the n-electrode pad may be located at substantially the same elevation as that of the lower p-electrode pad.

A display apparatus according to an exemplary embodiment includes: a circuit board; and a plurality of light emitting devices arranged on the circuit board, in which each of the light emitting devices may be any one of the light emitting device set forth above, and the bump pads are electrically connected to the circuit board.

Hereinafter, exemplary embodiments of the inventive concepts will be described in detail with reference to the accompanying drawings.

FIG. 1 shows schematic perspective views illustrating display apparatuses according to exemplary embodiments.

The display apparatus according to exemplary embodiments may be used in a VR display apparatus, such as a smart watch 1000a or a VR headset 1000b, or an AR display apparatus, such as augmented reality glasses 1000c. However, the inventive concepts are not limited thereto. The display apparatus may include a display panel for implementing an image.

Figure 2:
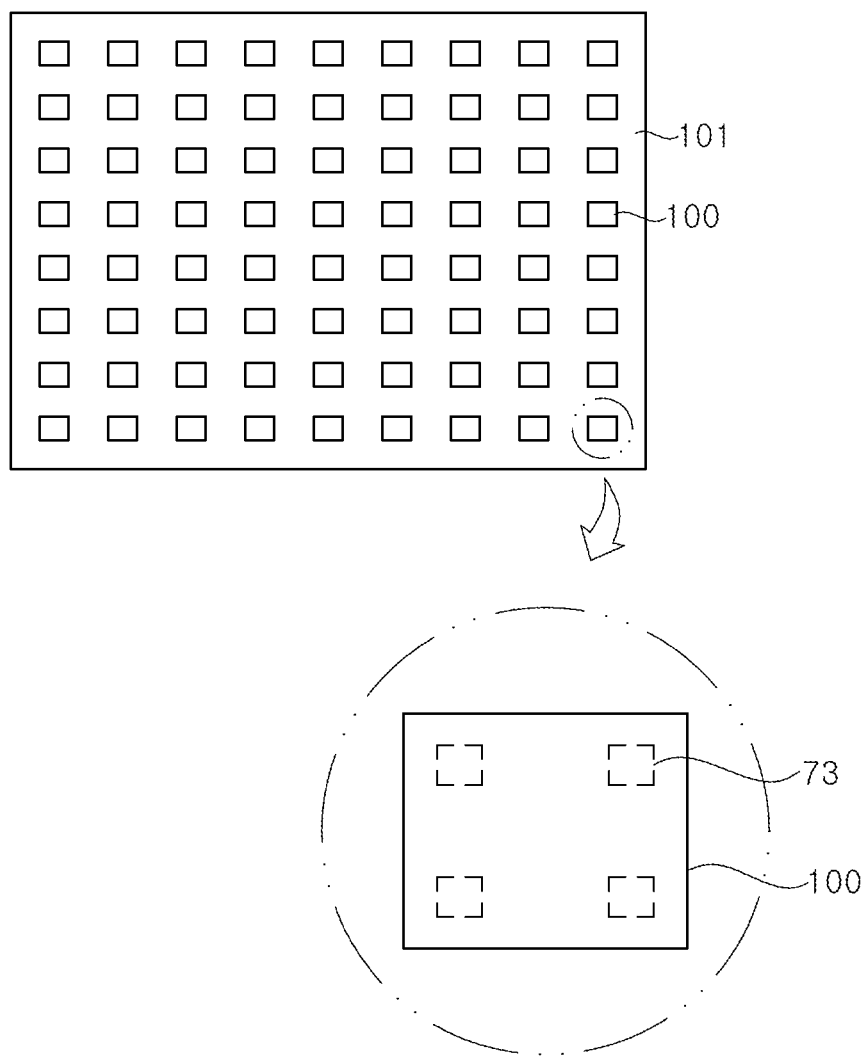
FIG. 2 is a schematic plan view illustrating a display panel according to an exemplary embodiment.

FIG. 2 is a schematic plan view illustrating the display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 are arranged on the circuit board 101. Each of the light emitting devices 100 may form one pixel. The light emitting device 100 includes bump pads 73, and the bump pads 73 are electrically connected to the circuit board 101. For example, the bump pads 73 may be bonded to pads exposed on the circuit board 101.

An interval between the light emitting devices 100 may be greater than at least a width of the light emitting device 100.

Figure 3A:
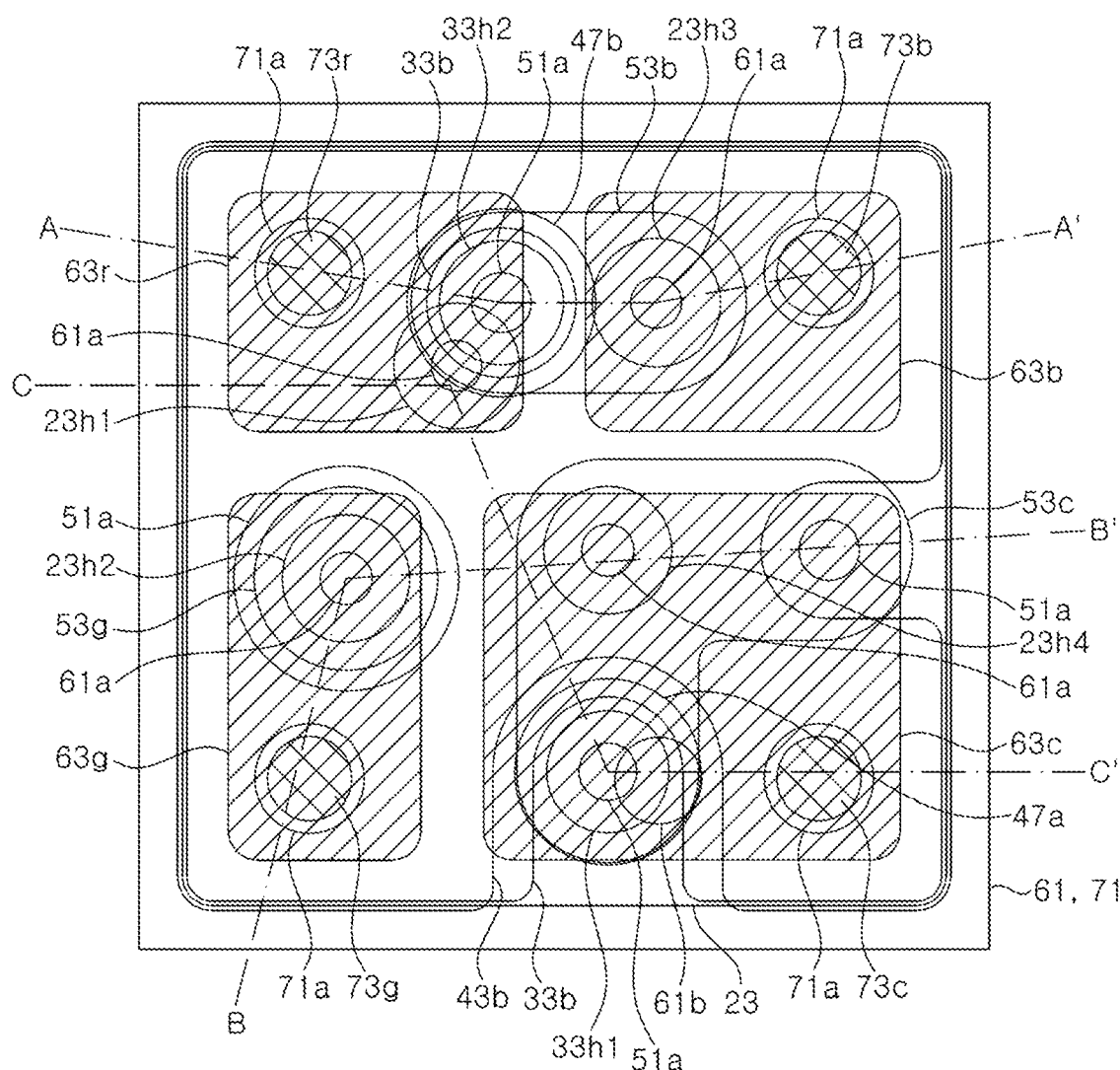
FIG. 3A is a schematic plan view illustrating a light emitting device according to an exemplary embodiment.
Figure 3B:
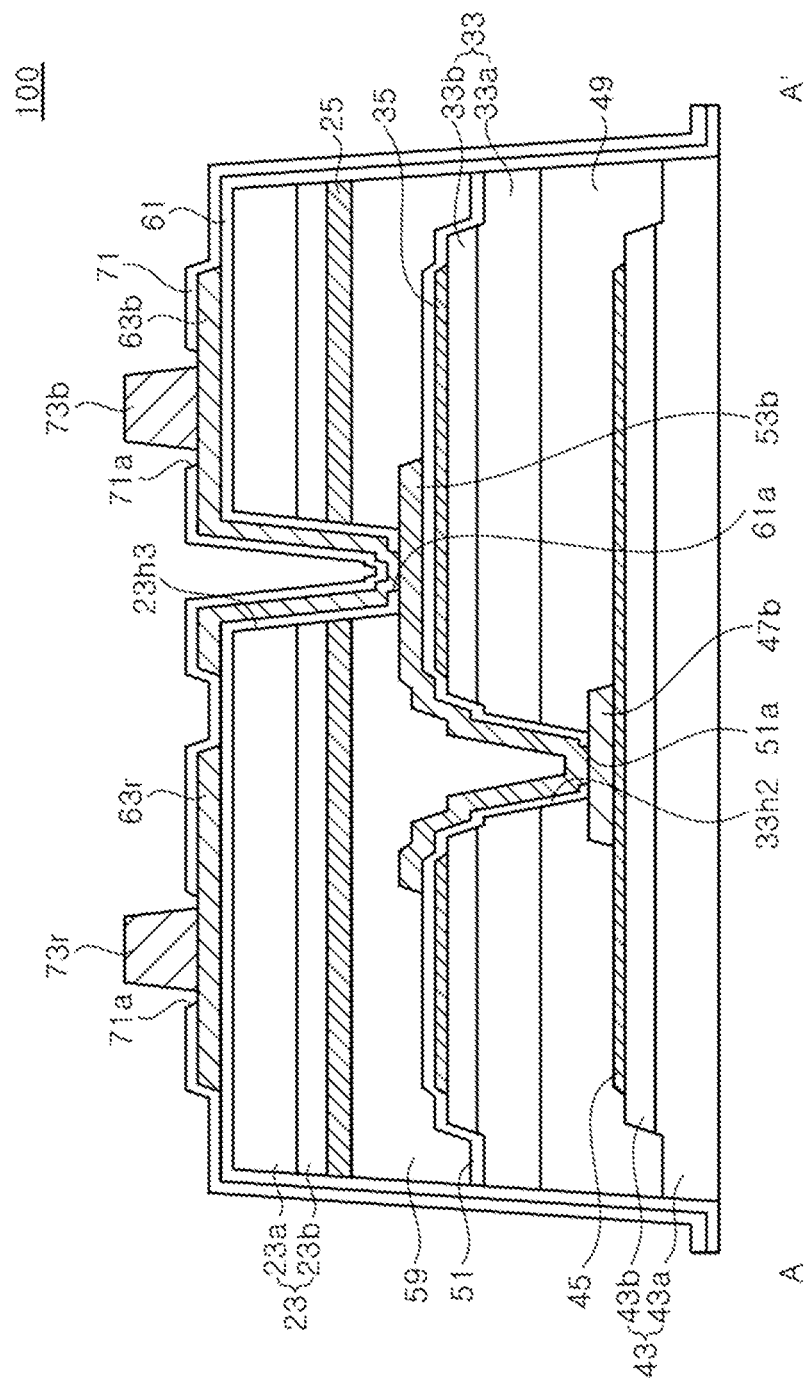
FIG. 3B, FIGS. 3C, and 3D are schematic cross-sectional views taken along the lines A-A', B-B', and C-C' of FIG. 3A, respectively.
Figure 3C:
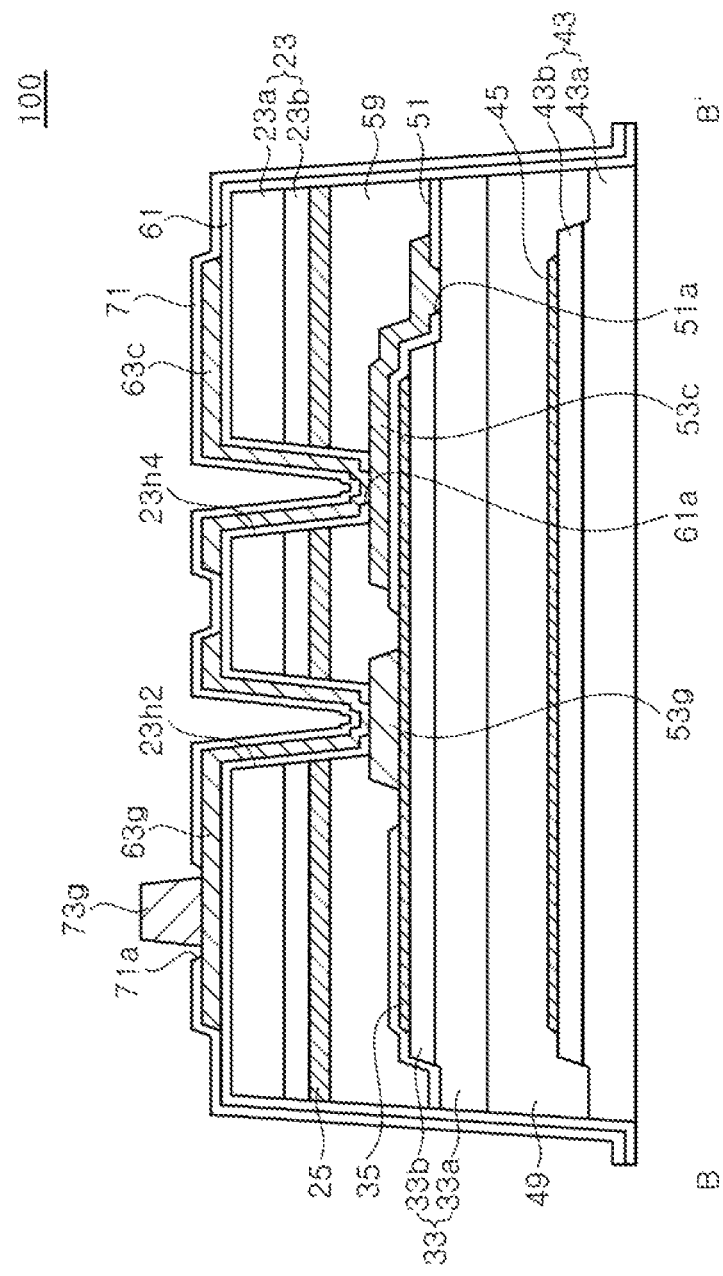
Figure 3D:
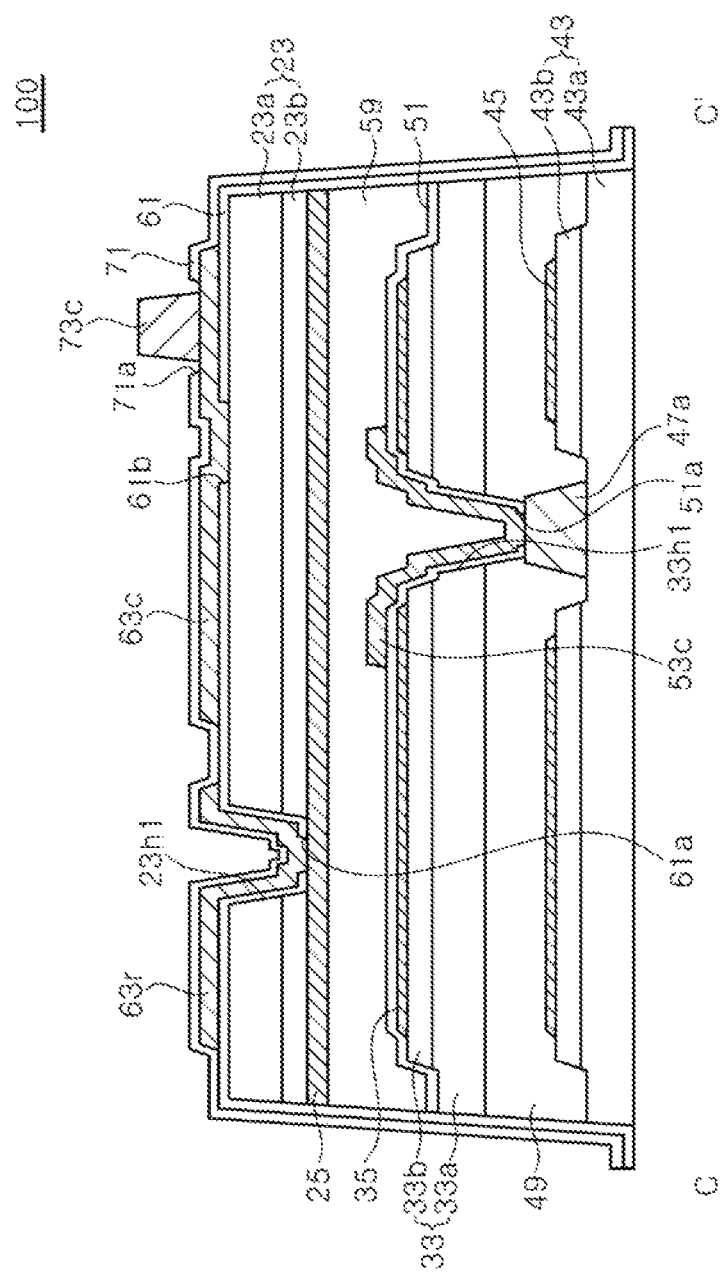

A configuration of the light emitting device 100 according to an exemplary embodiment will be described with reference to FIG. 3A, FIG. 3B, FIG. 3C, and FIG. 3D. FIG. 3A is a schematic plan view illustrating the light emitting device 100 according to an exemplary embodiment. FIG. 3B, FIGS. 3C, and 3D are schematic cross-sectional views taken along the lines A-A', B-B', and C-C' of FIG. 3A, respectively. Hereinafter, although the bump pads 73*r*, 73*b*, 73*g*, and 73*c* are exemplarily illustrated and described as being disposed at an upper side in FIG. 3A to FIG. 3D, the inventive concepts are not limited thereto. For example, in some exemplary embodiments, the light emitting device 100 may be flip-bonded on the circuit board 101 shown in FIG. 2, and in this case, the bump pads 73*r*, 73*b*, 73*g*, and 73*c* may be disposed at a lower side.

Referring to FIG. 3A, FIG. 3B, FIG. 3C and FIG. 3D, the light emitting device 100 may include a first LED stack 23, a second LED stack 33, a third LED stack 43, a first transparent electrode 25, a second transparent electrode 35, a third transparent electrode 45, an n-electrode pad 47a, a lower p-electrode pad 47b, an upper p-electrode pad 53g, a lower p-connector 53b, a lower common connector 53c, an upper common connector 63c, a first upper connector 63r, a second upper connector 63g, a third upper connector 63b, a first bonding layer 49, a second bonding layer 59, a lower insulation layer 51, an intermediate insulation layer 61, an upper insulation layer 71, and bump pads 73a, 73b, 73c, and 73d. The light emitting device 100 may further include through holes 23h1, 23h2, 23h3, and 23h4 passing through the first LED stack 23, and through holes 33h1 and 33h2 passing through the second LED stack 33.

As shown in FIG. 3B, the first, second, and third LED stacks 23, 33, and 43 according to an exemplary embodiment are stacked in the vertical direction. The first, second, and third LED stacks 23, 33, and 43 may be grown on different growth substrates from each other, and according to the illustrated exemplary embodiment, each of the growth substrates may be removed from the final light emitting device 100. As such, the light emitting device 100 does not include the growth substrates of the first, second, and third LED stacks 23, 33, and 43. However, the inventive concepts are not limited thereto, and in some exemplary embodiments, at least one of the growth substrates may be included in the light emitting device 100.

Each of the first LED stack 23, the second LED stack 33 and the third LED stack 43 includes a first conductivity type semiconductor layer 23a, 33a, or 43a, a second conductivity type semiconductor layer 23b, 33b, or 43b, and an active layer interposed therebetween. The active layer may have a multiple quantum well structure, for example.

The second LED stack 33 is disposed under the first LED stack 23, and the third LED stack 43 is disposed under the second LED stack 33. Light generated in the first to third LED stacks 23, 33, and 43 may be emitted to the outside through the third LED stack 43.

In an exemplary embodiment, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode to emitting blue light. For example, the first LED stack 23 may include an AlGaInP-based well layer, the second LED stack 33 may include an AlGaInP or AlGaInN-based well layer, and the third LED stack 43 may include an AlGaInN-based well layer.

Since the first LED stack 23 emits light having a longer wavelength than those emitted from the second and third LED stacks 33 and 43, light generated from the first LED stack 23 may be emitted to the outside after passing through the second and third LED stacks 33 and 43. In addition, since the second LED stack 33 emits light having a longer wavelength than that of emitted from the third LED stack 43, light generated from the second LED stack 33 may be emitted to the outside after passing through the third LED stack 43.

In another exemplary embodiment, the first LED stack 23 may emit light having a longer wavelength than those emitted from the second and third LED stacks 33 and 43, and the second LED stack 33 may emit light having a shorter wavelength than that emitted from the third LED stack 43. For example, the first LED stack 23 may be an inorganic light emitting diode emitting red light, the second LED stack 33 may be an inorganic light emitting diode emitting blue light, and the third LED stack 43 may be an inorganic light emitting diode emitting green light. For example, the first LED stack 23 may include an AlGaInP-based well layer, the second LED stack 33 may include an AlGaInN-based well layer, and the third LED stack 43 may include an AlGaInP-based or AlGaInN-based well layer.

A portion of light generated in the second LED 33 stack may be absorbed in the third LED stack 43, and thus, luminous intensity of light emitted from the second LED stack 33 may be relatively lower than that of light emitted from the first or third LED stacks 23 or 43. Accordingly, a ratio of luminance intensity of light emitted from the first to third LED stacks 23, 33, and 43 may be controlled.

According to the illustrated exemplary embodiment, the first conductivity type semiconductor layer 23a, 33a or 43a of each of the LED stacks 23, 33, and 43 may be an n-type semiconductor layer, and the second conductivity type semiconductor layer 23b, 33b or 43b thereof may be a p-type semiconductor layer. In addition, according to the illustrated exemplary embodiment, an upper surface of the first LED stack 23 may be an n-type semiconductor layer 23a, an upper surface of the second LED stack 33 may be a p-type semiconductor layer 33b, and an upper surface of the third LED stack 43 may be a p-type semiconductor layer 43b. More particular, the first LED stack 23 has a stacked sequence of semiconductor layers different from those of the second and third LED stacks 33 and 43. The semiconductor layers of the second LED stack 33 are stacked in the same order as the semiconductor layers of the third LED stack 43, and thus, process stability may be enhanced, which will be described in more detail later with reference to a manufacturing method.

The second LED stack 33 includes a mesa etching region, in which a portion of the second conductivity type semiconductor layer 33b is removed to expose an upper surface of the first conductivity type semiconductor layer 33a. The third LED stack 43 also includes a mesa etching region, in which a portion of the second conductivity type semiconductor layer 43b is removed to expose an upper surface of the first conductivity type semiconductor layer 43a. The first LED stack 23, however, may not include a mesa etching region. The through holes 33h1 and 33h2 may be formed in the mesa etching regions, and thus, sidewalls of the through holes 33h1 and 33h2 may have a stepped structure. In this case, since the first LED stack 23 does not include the mesa etching region, the through holes 23h1, 23h2, 23h3, and 23h4 may have uniformly inclined sidewalls without having stepped sidewalls.

The third LED stack 43 according to an exemplary embodiment may have a flat lower surface, without being limited thereto. For example, the third LED stack 43 may include irregularities on a surface of the first conductivity type semiconductor layer 43a, and light extraction efficiency may be improved by the irregularities. The irregularities on the surface of the first conductivity type semiconductor layer 43a may be formed by separating a patterned sapphire substrate or by texturing the surface after separating the growth substrate, for example. In some exemplary embodiments, the first conductivity type semiconductor layer 33a of the second LED stack 33 may also have a textured surface.

The first LED stack 23, the second LED stack 33 and the third LED stack 43 according to the illustrated exemplary embodiment may be stacked to overlap one another, and may also have substantially the same luminous area. However, the luminous area of the first LED stack 23 may be smaller than that of the second LED stack 33, and the luminous area of the second LED stack 33 may be smaller than that of the third LED stack 43, by the through holes 23$h$1, 23$h$2, 23$h$3, and 23$h$4 and the through holes 33$h$1 and 33$h$2. In addition, a side surface of the light emitting device 100 may be inclined, such that a width of the light emitting device 100 may be gradually increasing from the first LED stack 23 to the third LED stack 43. As such, the luminous area of the third LED stack 43 may be larger than that of the first LED stack 23. An inclination angle of the side surface of the light emitting device 100 with respect to the upper surface of the third LED stack 43 may be about 75 degrees to about 90 degrees. When the inclination angle is less than 75 degrees, the luminous area of the first LED stack 23 may become too small, and thus, it may be difficult to reduce a size of the light emitting device 100.

The first transparent electrode 25 is disposed between the first LED stack 23 and the second LED stack 33. The first transparent electrode 25 is in ohmic contact with the second conductivity type semiconductor layer 23$b$ of the first LED stack 23, and transmits light generated by the first LED stack 23. The first transparent electrode 25 may be formed using a transparent oxide layer or a metal layer, such as indium tin oxide (ITO). The first transparent electrode 25 may cover an entire surface of the second conductivity type semiconductor layer 23$b$ of the first LED stack 23, and a side surface thereof may be disposed in parallel with a side surface of the first LED stack 23. More particular, the side surface of the first transparent electrode 25 may not be covered with the second bonding layer 59. Furthermore, the through holes 23$h$2, 23$h$3, and 23$h$4 may pass through the first transparent electrode 25, and thus, the first transparent electrode 25 may be exposed by the sidewalls of the through holes 23$h$2, 23$h$3, and 23$h$4. Meanwhile, the through hole 23$h$1 exposes an upper surface of the first transparent electrode 25. However, the inventive concepts are not limited thereto, and in some exemplary embodiments, the first transparent electrode 25 may be partially removed along an edge of the first LED stack 23, and thus, at least a portion of the side surface of the first transparent electrode 25 may be covered with the second bonding layer 59. In addition, when the first transparent electrode 25 is previously patterned and removed in a region where the through holes 23$h$2, 23$h$3, and 23$h$4 are formed according to other exemplary embodiments, the first transparent electrode 25 may not be exposed by the sidewalls of the through holes 23$h$2, 23$h$3, and 23$h$4.

A second transparent electrode 35 is in ohmic contact with the second conductivity type semiconductor layer 33$b$ of the second LED stack 33. As shown in the drawings, the second transparent electrode 35 contacts the upper surface of the second LED stack 33 between the first LED stack 23 and the second LED stack 33. The second transparent electrode 35 may be formed of a metal layer or a conductive oxide layer that is transparent to red light. For example, the conductive oxide layer may include $SnO_2$, $InO_2$, ITO, ZnO, IZO, or the like. In particular, the second transparent electrode 35 may be formed of ZnO, which may be formed as a single crystal on the second LED stack 33. In this manner, the ZnO may have favorable electrical and optical characteristics as compared with the metal layer or other conductive oxide layers. In particular, ZnO has a strong bonding force to the second LED stack 33, and remains undamaged even when the growth substrate is separated using a laser lift-off process during manufacture.

The second transparent electrode 35 may be partially removed along an edge of the second LED stack 33, and, accordingly, an outer side surface of the second transparent electrode 35 is not exposed to the outside, but is covered with the lower insulation layer 51. In particular, the side surface of the second transparent electrode 35 is recessed inwardly than that of the second LED stack 33, and a region where the second transparent electrode 35 is recessed is filled with the lower insulation layer 51 and the second bonding layer 59. The second transparent electrode 35 is also recessed near the mesa etching region of the second LED stack 33, and the recessed region is filled with the lower insulation layer 51 and the second bonding layer 59.

The third transparent electrode 45 is in ohmic contact with the second conductivity type semiconductor layer 43$b$ of the third LED stack 43. The third transparent electrode 45 may be disposed between the second LED stack 33 and the third LED stack 43, and contacts the upper surface of the third LED stack 43. The third transparent electrode 45 may be formed of a metal layer or a conductive oxide layer that is transparent to red light and green light. For example, the conductive oxide layer may include $SnO_2$, $InO_2$, ITO, ZnO, IZO, or the like. In particular, the third transparent electrode 45 may be formed of ZnO, which may be formed as a single crystal on the third LED stack 43. In this manner, the ZnO may have favorable electrical and optical characteristics as compared with the metal layer or other conductive oxide layers. In particular, ZnO has a strong bonding force to the third LED stack 43, and remains undamaged even when the growth substrate is separated using the laser lift-off process during manufacture.

The third transparent electrode 45 may be partially removed along an edge of the third LED stack 43, and, accordingly, an outer side surface of the third transparent electrode 45 is not exposed to the outside, but is covered with the first bonding layer 49. In particular, the side surface of the third transparent electrode 45 is recessed inwardly than that of the third LED stack 43, and a region where the third transparent electrode 45 is recessed is filled with the first bonding layer 49. The third transparent electrode 45 is also recessed near the mesa etching region of the third LED stack 43, and the recessed region is filled with the first bonding layer 49.

The second transparent electrode 35 and the third transparent electrode 45 are recessed as described above, and thus, the side surfaces of the second transparent electrode 35 and the third transparent electrode 45 may be prevented from being exposed to an etching gas, thereby improving the production yield of the light emitting device 100.

According to an exemplary embodiment, the second transparent electrode 35 and the third transparent electrode 45 may be formed of the same kind of conductive oxide layer, for example, ZnO, and the first transparent electrode 25 may be formed of a different kind of conductive oxide layer from the second and third transparent electrodes 35 and 45, such as ITO. However, the inventive concepts are not limited thereto, and each of the first to third transparent electrodes 25, 35, and 45 may be of the same kind, or at least one may be of a different kind.

The first to third transparent electrodes 25, 35, and 45 may be formed using a technique, such as thermal deposition, sputtering, sol-gel, hydrothermal synthesis, or the like. In particular, a transparent electrode formed through a chemically thin-film forming method, such as hydrothermal synthesis method, may generate a porous thin-film. In this case, voids in the porous thin-film may improve the light extraction efficiency of the LED stack, and may further relieve stress.

The voids may be controlled to be distributed at locations to enhance the optical properties of the LED stack. According to an exemplary embodiment, the voids may be distributed generally close to a side of the second conductivity type semiconductor layer 22b, 33b, and 43b at one half point of the transparent electrode. The transparent electrode formed through the hydrothermal synthesis method may have voids and also have crystallinity, and, in particular, may be formed of a single crystal.

According to another exemplary embodiment, the voids may be distributed relatively uniformly over a wide area. The transparent electrode including the voids has an improved light extraction efficiency compared to a transparent electrode without the voids. The transparent electrode may be, for example, a ZnO layer or a doped ZnO layer. The doped ZnO layer may include at least one of, for example, silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd), as a dopant.

In an exemplary embodiment, the ZnO layer may also include a ZnO seed layer and a ZnO bulk layer. The ZnO seed layer has a relatively continuous surface. In addition, the ZnO seed layer and the ZnO bulk layer form a single crystal structure. In an exemplary embodiment, the ZnO seed layer and the ZnO bulk layer do not exhibit any interface between the ZnO seed layer and the ZnO bulk layer. In an exemplary embodiment, the ZnO seed layer has a thickness of several hundred angstroms. The ZnO seed layer may have, for example, a thickness of 200 angstroms or less. The ZnO bulk layer may have a thickness of 1 μm or less. In an exemplary embodiment, the ZnO bulk layer has a thickness of 8000 angstroms or less.

The n-electrode pad 47a is in ohmic contact with the first conductivity type semiconductor layer 43a of the third LED stack 43. The n-electrode pad 47a may be disposed on the first conductivity type semiconductor layer 43a exposed through the second conductivity type semiconductor layer 43b, that is, in the mesa etching region. The n-electrode pad 47a may be formed of, for example, Cr/Au/Ti. An upper surface of the n-electrode pad 47a may be placed higher than that of the second conductivity type semiconductor layer 43b, and further, higher than that of the third transparent electrode 45. For example, a thickness of the n-electrode pad 47a may be about 2 μm or more. The n-electrode pad 47a may have a shape of a truncated cone, but is not limited thereto. The n-electrode pad 47a may have various shapes, such as a square pyramid, a cylindrical shape, or a cylindrical shape.

The lower p-electrode pad 47b may include substantially the same material as the n-electrode pad 47a. An upper surface of the lower p-electrode pad 47b is located at the substantially same elevation as the n-electrode pad 47a, and, accordingly, a thickness of the lower p-electrode pad 47b may be less than that of the n-electrode pad 47a. More particularly, the thickness of the lower p-electrode pad 47b may be approximately equal to a thickness of a portion of the n-electrode pad 47a protruding above the third transparent electrode 45. For example, the thickness of the lower p-electrode pad 47b may be about 1.2 μm or less. The upper surface of the lower p-electrode pad 47b is located at substantially the same elevation as that of the n-electrode pad 47a, and thus, the lower p-electrode pad 47b and the n-electrode pad 47a may be simultaneously exposed when the through holes 33h1 and 33h2 are formed. When the elevations of the n-electrode pad 47a and the lower p-electrode pad 47b are different, any one of the electrode pads may be damaged in the etching process. As such, the elevations of the n-electrode pad 47a and the lower p-electrode pad 47b are set to be approximately equal, and thus, it is possible to prevent any one of the electrode pads from being damaged during the etching process or the like.

The first bonding layer 49 couples the second LED stack 33 to the third LED stack 43. The first bonding layer 49 may be disposed between the first conductivity type semiconductor layer 33a and the third transparent electrode 45. The first bonding layer 49 may partially contact the second conductivity type semiconductor layer 43b, and may partially contact the first conductivity type semiconductor layer 43a exposed by the mesa etching region. In addition, the first bonding layer 49 may cover the n-electrode pad 47a and the lower p-electrode pad 47.

The first bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, SiNx, or the like. In addition, the first bonding layer 49 may be formed of spin-on-glass (SOG).

The through hole 33h1 and the through hole 33h2 pass through the second LED stack 33 and the first bonding layer 49 to expose the n-electrode pad 47a and the lower p-electrode pad 47b, respectively. As described above, the through holes 33h1 and 33h2 may be formed in the mesa etching region, and thus, the through holes 33h1 and 33h2 may have stepped sidewalls.

The lower insulation layer 51 is formed on the second LED stack 33, and covers the second transparent electrode 35. The lower insulation layer 51 also covers the sidewalls of the through holes 33h1 and 33h2. The lower insulation layer 51 may have openings 51a exposing the n-electrode pad 47a, the lower p-electrode pad 47b, the first conductivity type semiconductor layer 33a, and the second transparent electrode 35. The lower insulation layer 51 may be formed of a silicon oxide film or a silicon nitride film, and may be formed to have a thickness of, for example, about 800 nm.

The lower common connector 53c may be disposed on the lower insulation layer 51, and connected to the first conductivity type semiconductor layer 33a and the n-electrode pad 47a exposed through the openings 51a of the lower insulation layer 51. In particular, the lower common connector 53c is connected to the first conductivity type semiconductor layer 33a in the mesa etching region of the second LED stack 33, and is connected to the n-electrode pad 47a through the through hole 33h1.

The lower p-connector 53b may be disposed on the lower insulation layer 51, and connected to the lower p-electrode pad 47b exposed through the opening 51a of the lower insulation layer 51. At least a portion of the lower p-connector 53b is disposed on the lower insulation layer 51.

The upper p-electrode pad 53g may be disposed on the second transparent electrode 35 in the opening 51a of the lower insulation layer 51. As shown in FIG. 3A and FIG. 3C, the upper p-electrode pad 53g may be disposed in the opening 51a with a narrower width than that of the opening 51a. However, the inventive concepts are not limited thereto, and in some exemplary embodiments, the width of the upper p-electrode pad 53g may be greater than that of the opening 51a, and a portion of the upper p-electrode pad 53g may be disposed on the lower insulation layer 51.

The lower common connector 53c, the lower p-connector 53b, and the upper p-electrode pad 53g may be formed together in the same process and may include substantially the same material. For example, the lower common connector 53c, the lower p-connector 53b, and the upper p-electrode pad 53g may include Ni/Au/Ti, and may be formed to have a thickness of about 2 μm.

The second bonding layer 59 couples the first LED stack 23 to the second LED stack 33. As shown, the second bonding layer 59 may be disposed between the first transparent electrode 25 and the lower insulation layer 51. The second bonding layer 59 may also cover the lower common connector 53c, the lower p-connector 53b, and the upper p-electrode pad 53g. The second bonding layer 59 may also partially contact the second transparent electrode 35 exposed through the opening 51a of the lower insulation layer 51. The second bonding layer 59 may include substantially the same material that may form the first bonding layer 49 described above, and thus, repeated descriptions thereof will be omitted to avoid redundancy.

The through holes 23h1, 23h2, 23h3, and 23h4 pass through the first LED stack 23. The through hole 23h1 is formed to provide a passage for allowing electrical connection to the first transparent electrode 25. In the illustrated exemplary embodiment, the through hole 23h1 exposes the upper surface of the first transparent electrode 25, and does not pass through the first transparent electrode 25. However, the inventive concepts are not limited thereto, and in some exemplary embodiments, the through hole 23h1 may pass through the first transparent electrode 25, as long as the through hole 23h1 provides the passage for electrical connection to the first transparent electrode 25.

The through holes 23h2, 23h3, and 23h4 may pass through the first LED stack 23, and may also pass through the second bonding layer 59. The through hole 23h2 exposes the upper p-electrode pad 53g, the through hole 23h3 exposes the lower p-connector 53b, and the through hole 23h4 exposes the lower common connector 53c.

The through holes 23h1, 23h2, 23h3, and 23h4 may be formed by etching the first conductivity type semiconductor layer 23a and the second conductivity type semiconductor layer 23b in the same process, and thus, the sidewalls of the through holes 23h1, 23h2, 23h3, and 23h4 may have inclined surfaces without having a stepped structure.

The intermediate insulation layer 61 covers the first LED stack 23, and covers the sidewalls of the through holes 23h1, 23h2, 23h3, and 23h4. The intermediate insulation layer 61 may also cover side surfaces of the first to third LED stacks 23, 33, and 43. The intermediate insulation layer 61 may be patterned to have openings 61a exposing a bottom portion of each of the through holes 23h1, 23h2, 23h3, and 23h4. The first transparent electrode 25, the upper p-electrode pad 53g, the lower p-connector 53b, and the lower common connector 53c may be exposed in the through holes 23h1, 23h2, 23h3, and 23h4 by the openings 61a. Further, the intermediate insulation layer 61 may have an opening 61b exposing the upper surface of the first LED stack 23, that is, the first conductivity type semiconductor layer 23a. The intermediate insulation layer 61 may be formed of an aluminum oxide film, a silicon oxide film, or a silicon nitride film, and may be formed to have a thickness of, for example, about 800 nm.

The first upper connector 63r, the second upper connector 63g, the third upper connector 63b, and the upper common connector 63c are disposed on the intermediate insulation layer 61. Each of the upper connectors 63r, 63g, 63b, and 63c is connected to the first transparent electrode 25, the upper p-electrode pad 53g, and the lower p-connector 53b exposed through the openings 61a of the intermediate insulation layer 61, respectively. Furthermore, the upper common connector 63c may be connected to the first conductivity type semiconductor layer 23a exposed to the opening 61b.

The first upper connector 63r, the second upper connector 63g, the third upper connector 63b, and the upper common connector 63c may be formed of substantially the same material, for example, AuGe/Ni/Au/Ti, in the same process. In this case, AuGe may be in ohmic contact with the first conductivity type semiconductor layer 23a. AuGe may be formed to have a thickness of about 100 nm, and Ni/Au/Ti may be formed to have a thickness of about 2 um. In some exemplary embodiments, AuTe may replace AuGe.

The upper insulation layer 71 covers the intermediate insulation layer 61, and covers the first upper connector 63r, the second upper connector 63g, the third upper connector 63b, and the upper common connector 63c. The upper insulation layer 71 may also cover the intermediate insulation layer 61 on the side surfaces of the first to third LED stacks 23, 33, and 43. The upper insulation layer 71 may have openings 71a exposing the first upper connector 63r, the second upper connector 63g, the third upper connector 63b, and the upper common connector 63c. The openings 71a of the upper insulation layer 71 may be generally disposed on flat surfaces of the first upper connector 63r, the second upper connector 63g, the third upper connector 63b, and the upper common connector 63c. The upper insulation layer 71 may be formed of a silicon oxide film or a silicon nitride film, and may be formed thinner than the intermediate insulation layer 61, for example, about 400 nm thick.

Each of the bump pads 73r, 73g, 73b, and 73c may be disposed on the first upper connector 63r, the second upper connector 63g, and the third upper connector 63b, and the common connector 63c in the openings 71a of the upper insulation layer 71 and electrically connected thereto.

The first bump pad 73r may be electrically connected to the second conductivity type semiconductor layer 23b of the first LED stack 23 through the first upper connector 63r and the first transparent electrode 25.

The second bump pad 73g may be electrically connected to the second conductivity type semiconductor layer 33b of the second LED stack 33 through the second upper connector 63g, the upper p-electrode pad 53g, and the second transparent electrode 35.

The third bump pad 73b may be electrically connected to the second conductivity type semiconductor layer 43b of the third LED stack 43 through the third upper connector 63b, the lower p-connector 53b, the lower p-electrode pad 47b, and the third transparent electrode 45.

The common bump pad 73c may be electrically connected to the first conductivity type semiconductor layer 23a of the first LED stack 23 through the upper common connector 63c, electrically connected to the first conductivity type semiconductor layer 33a of the second LED stack 33 through the lower common connector 53c, and electrically connected to the first conductivity type semiconductor layer 43a of the third LED stack 43 through the n-electrode pad 47a.

As such, each of the first to third bump pads 73r, 73g, and 73b may be electrically connected to the second conductivity type semiconductor layers 23b, 33b, and 43b of the first to third LED stacks 23, 33, and 43, and the common bump pad 73c may be commonly electrically connected to the first conductivity type semiconductor layers 23a, 33a, and 43a of the first to third LED stacks 23, 33, and 43.

The bump pads 73r, 73g, 73b, and 73c may be disposed in the openings 71a of the upper insulation layer 71, and upper surfaces of the bump pads 73r, 73g, 73b, and 73c may be substantially flat. The bump pads 73r, 73g, 73b, and 73c may be disposed on the flat surfaces of the first to third upper connectors 63r, 63g, and 63b, and the upper common connector 63c. The bump pads 73r, 73g, 73b, and 73c may be formed of Au/In. For example, Au may be formed to have a thickness of about 3 µm, and In may be formed to have a thickness of about 1 µm. According to an exemplary embodiment, the light emitting device 100 may be bonded to the pads on the circuit board 101 using In. However, the inventive concepts are not limited thereto, and in some exemplary embodiments, the light emitting device 100 may be bonded to the pads using Pb or AuSn of the bump pads.

In the illustrated exemplary embodiment, the upper surfaces of the bump pads 73r, 73g, 73b, and 73c are described and illustrated as being flat, but the inventive concepts are not limited thereto. For example, in some exemplary embodiments, the bump pads 73r, 73g, 73b, and 73c may have irregular upper surfaces, and some of the bump pads may be disposed on the upper insulation layer 71.

According to the illustrated exemplary embodiment, the first LED stack 23 is electrically connected to the bump pads 73r and 73c, the second LED stack 33 is electrically connected to the bump pads 73g and 73c, and the third LED stack 43 is electrically connected to the bump pads 73b and 73c. Accordingly, cathodes of the first LED stack 23, the second LED stack 33, and the third LED stack 43 are electrically connected to the common bump pad 73c, and anodes thereof are electrically connected to the first to third bump pads 73a, 73b, and 73c, respectively. Accordingly, the first to third LED stacks 23, 33, and 43 may be driven independently.

Figure 4A:
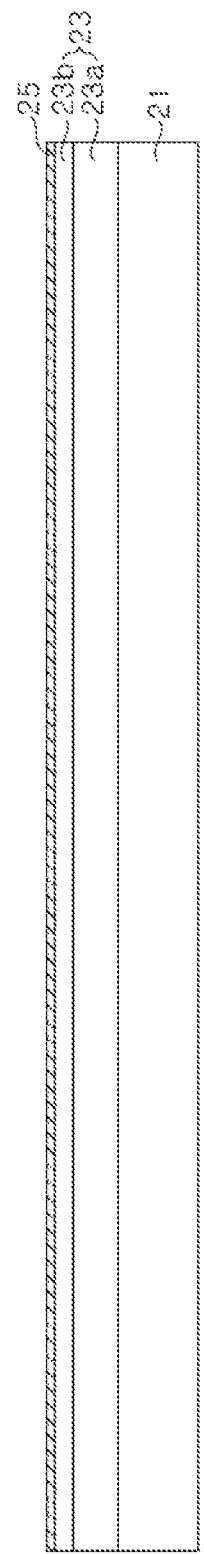
FIG. 4A, FIG. 4B, and FIG. 4C are schematic cross-sectional views illustrating first, second, and third LED stacks grown on a growth substrate, respectively, according to an exemplary embodiment.
Figure 4B:
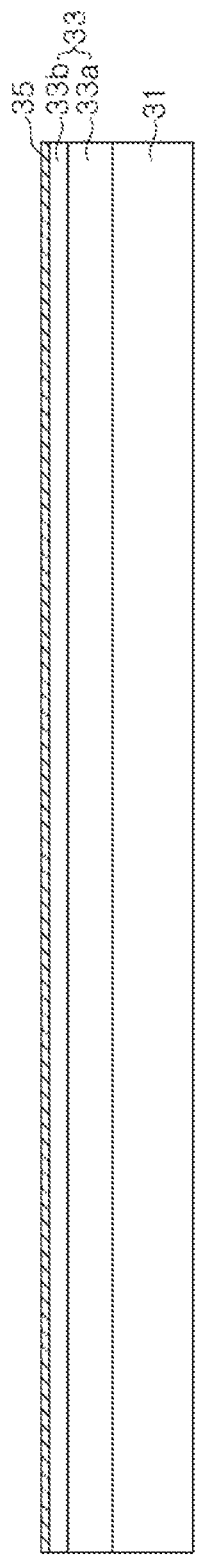
Figure 4C:
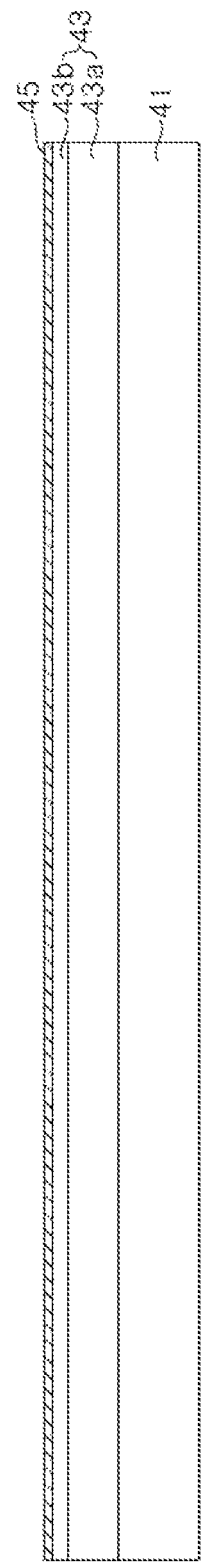

A structure of the light emitting device 100 will be further described through a method of manufacturing the light emitting device 100 described below. FIG. 4A, FIG. 4B, and FIG. 4C are schematic cross-sectional views illustrating the first to third LED stacks grown on growth substrates, respectively, according to an exemplary embodiment.

First, referring to FIG. 4A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Referring to FIG. 4B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a GaN substrate, or a GaAs substrate. The first conductivity type semiconductor layer 33a and the second conductivity type semiconductor layer 33b may be formed of an AlGaInAs-based or AlGaInP-based semiconductor layer, an AlGaInN-based semiconductor layer, and the active layer may include, for example, an AlGaInP-based well layer or AlGaInN-based well layer. A composition ratio of AlGaInP or AlGaInN may be determined so that the second LED stack 33 emits green light, for example.

A second transparent electrode 35 may be formed on the second conductivity type semiconductor layer 33b. As described above, the second transparent electrode 35 may be formed of a metal layer or a conductive oxide layer that transmits light generated by the first LED stack 23, for example, red light. In particular, the second transparent electrode 35 may be formed of ZnO.

Referring to FIG. 4C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a SiC substrate, or a GaN substrate. In an exemplary embodiment, the third substrate 41 may be a flat sapphire substrate, but may also be a patterned sapphire substrate. The first conductivity type semiconductor layer 43a and the second conductivity type semiconductor layer 43b may be formed of an AlGaInN-based semiconductor layer, and the active layer may include, for example, an AlGaInN-based well layer. A composition ratio of AlGaInN may be determined so that the third LED stack 43 emits blue light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and green light. In particular, the third transparent electrode 45 may be formed of ZnO.

The first to third LED stacks 23, 33, and 43 are grown on the different growth substrates 21, 31, and 41, respectively, and, accordingly, the order of the manufacturing process is not particularly limited.

Hereinafter, a method of manufacturing the light emitting device 100 using first to third LED stacks 23, 33, and 43 grown on growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, and 13D are schematic plan views and cross-sectional views illustrating the method of manufacturing the light emitting device 100 for a display according to an exemplary embodiment of the present disclosure. Hereinafter, the cross-sectional views are shown to correspond to those shown in FIGS. 3B, 3C, and 3D, respectively.

Figure 5A:
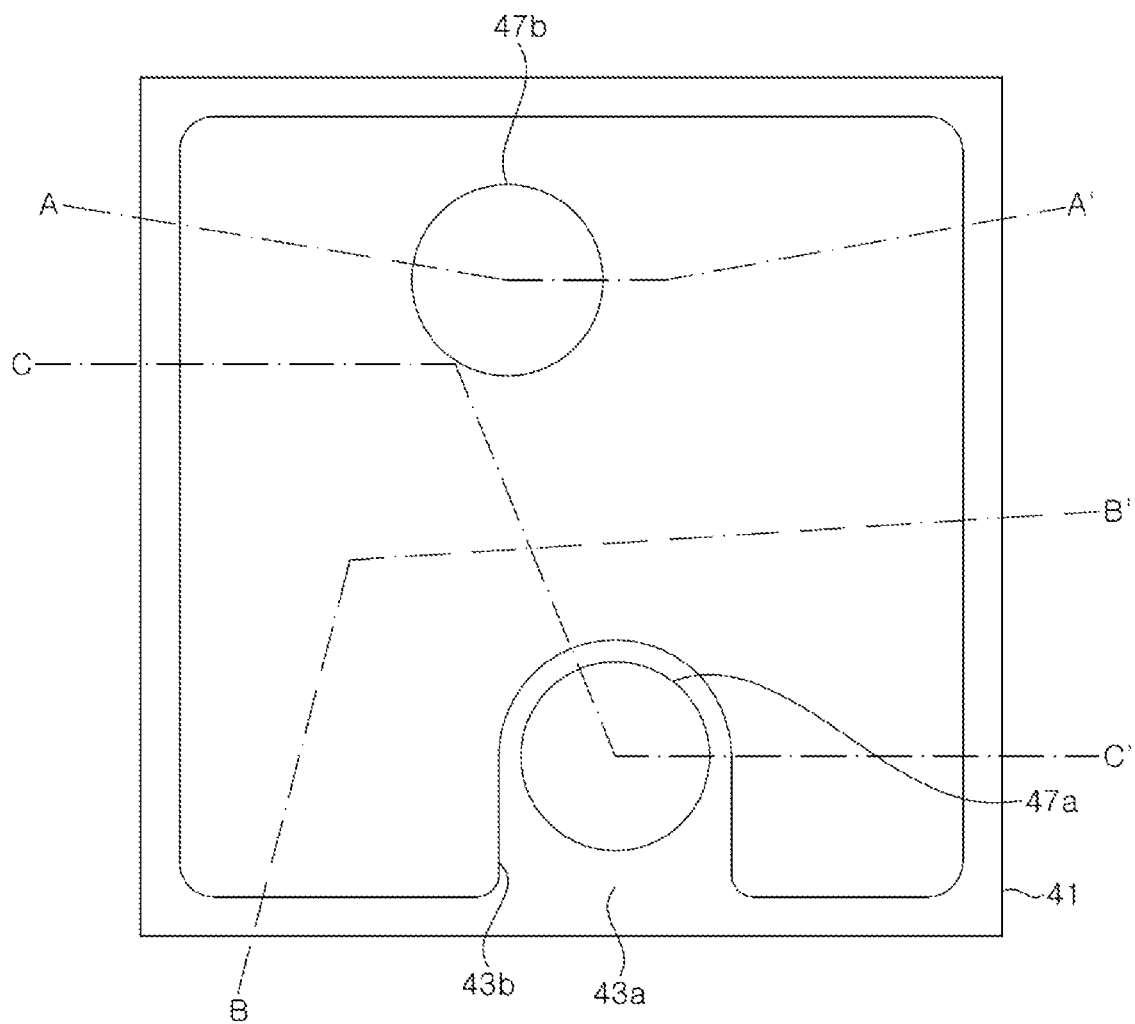
Figure 5B:
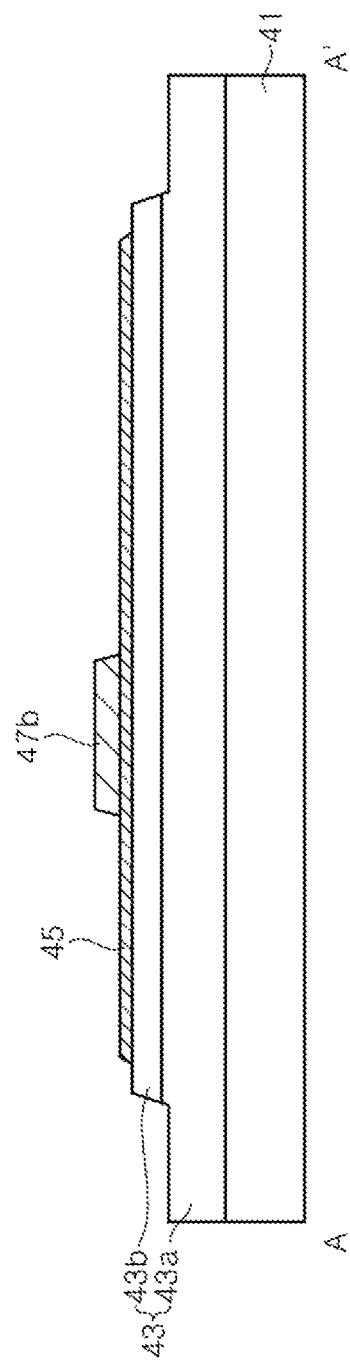
Figure 5C:
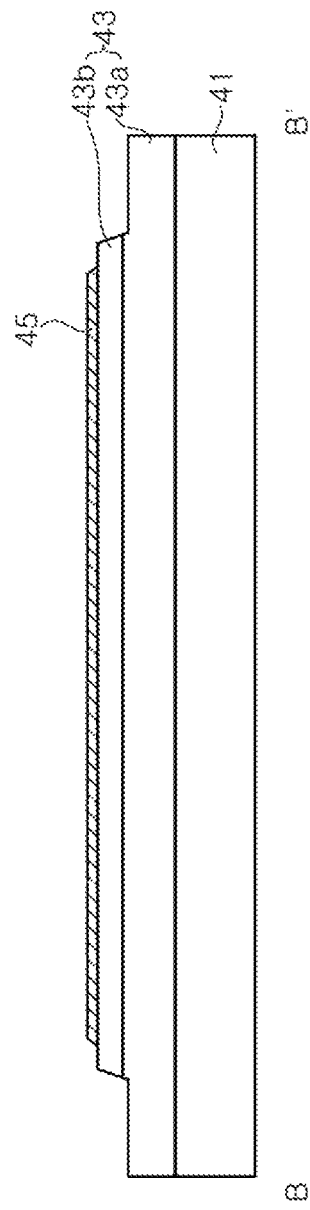
Figure 5D:
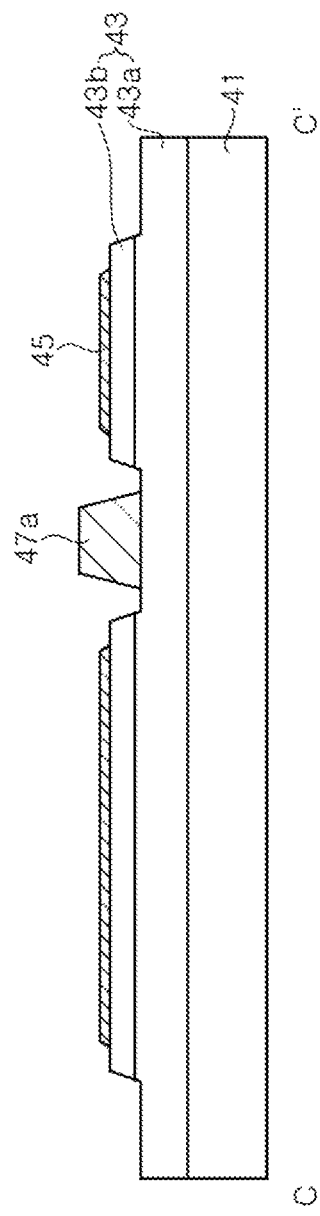

First, referring to FIG. 5A, FIG. 5B, FIG. 5C, and FIG. 5D, the third transparent electrode 45 and the second conductivity type semiconductor layer 43b of the third LED stack 43 are patterned to expose the first conductivity type semiconductor layer 43a using photo and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 5A exemplarily shows an edge of the mesa and does not show an edge of the third transparent electrode 45 to simplify illustrating. However, since the third transparent electrode 45 is wet etched using the same etching mask, the edge of the third transparent electrode 45 may also be recessed from the edge of the mesa toward an inner side of the mesa. Since the same etching mask is used, the number of photo processes may not be increased, thereby reducing the process costs. However, the inventive concepts are not limited thereto, and the etching mask for etching the mesa etching process may be different from the etching mask for etching the third transparent electrode 45.

Subsequently, an n-electrode pad 47a and a lower p-electrode pad 47b are formed on the first conductivity type semiconductor layer 43a and the third transparent electrode 45, respectively. The n-electrode pad 47a and the lower p-electrode pad 47b may be formed to have different thicknesses. In particular, an upper surface of the n-electrode pad 47a and that of the lower p-electrode pad 47b may be located at substantially the same elevation.

Referring to FIG. 6A, FIG. 6B, FIG. 6C, and FIG. 6D, the second LED stack 33 shown in FIG. 4B is bonded onto the third LED stack 43 described with reference to FIG. 5A, FIG. 5B, FIG. 5C, and FIG. 5D. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique. Accordingly, the second LED stack 33 may be disposed on the third LED stack 43, in which the second transparent electrode 35 may form an upper surface.

In general, when the second transparent electrode 35 is formed of ITO, ITO may be peeled from the second LED stack 33 when the second substrate 31 is removed using the laser lift off technique. As such, when the second substrate 31 is to be removed using the laser lift-off technique, the second transparent electrode 35 may include ZnO, which has a favorable bonding force.

Subsequently, the second transparent electrode 35 and the second conductivity type semiconductor layer 33b are patterned to expose the first conductivity type semiconductor layer 33a. The second transparent electrode 35 and the second conductivity type semiconductor layer 33b may be patterned by using photo and etching techniques. This process may be performed using the wet etching and the dry etching techniques in substantially the same manner as the mesa etching process, during which the third transparent electrode 45 and the second conductivity type semiconductor layer 43b are etched as described above.

Figure 6A:
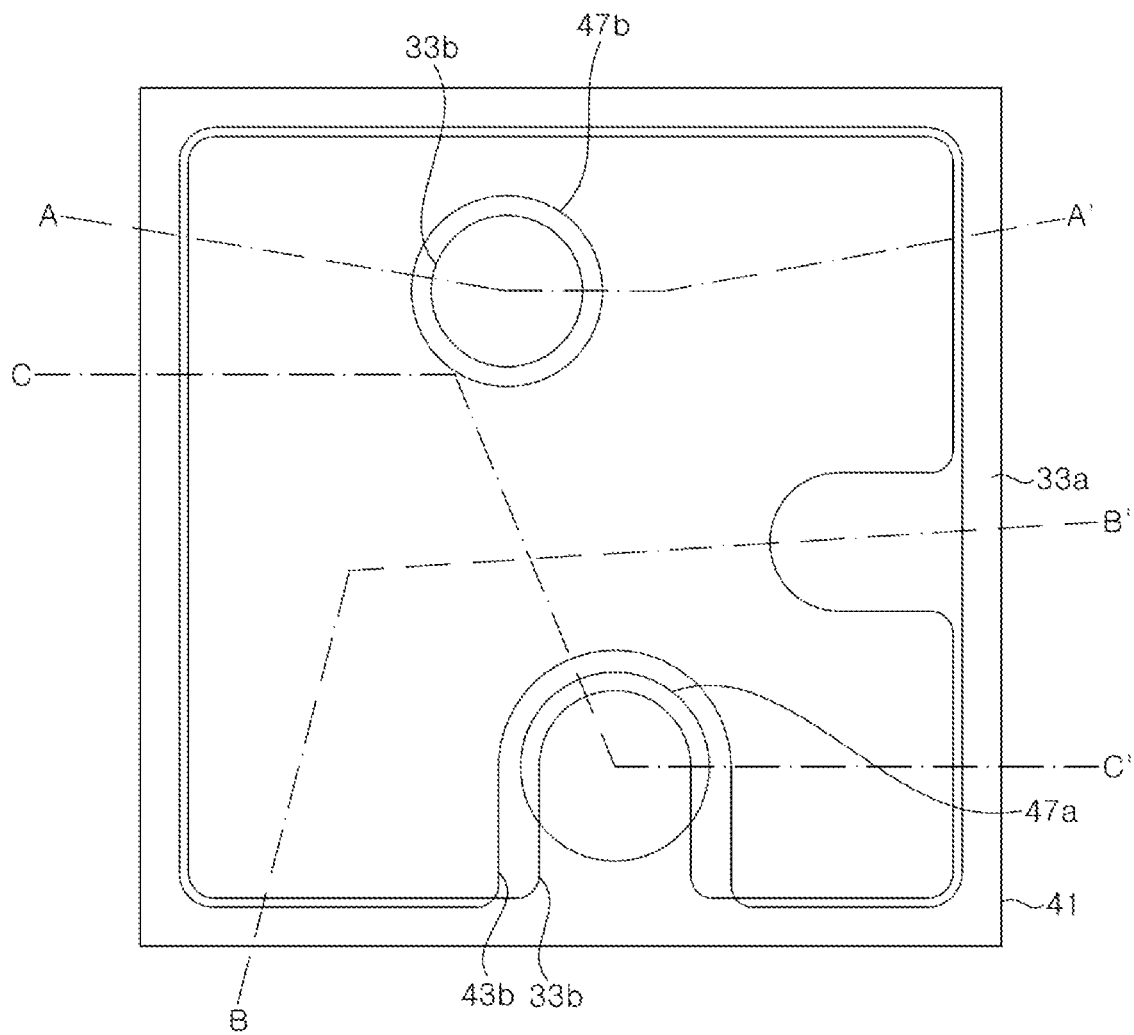
Figure 6B:
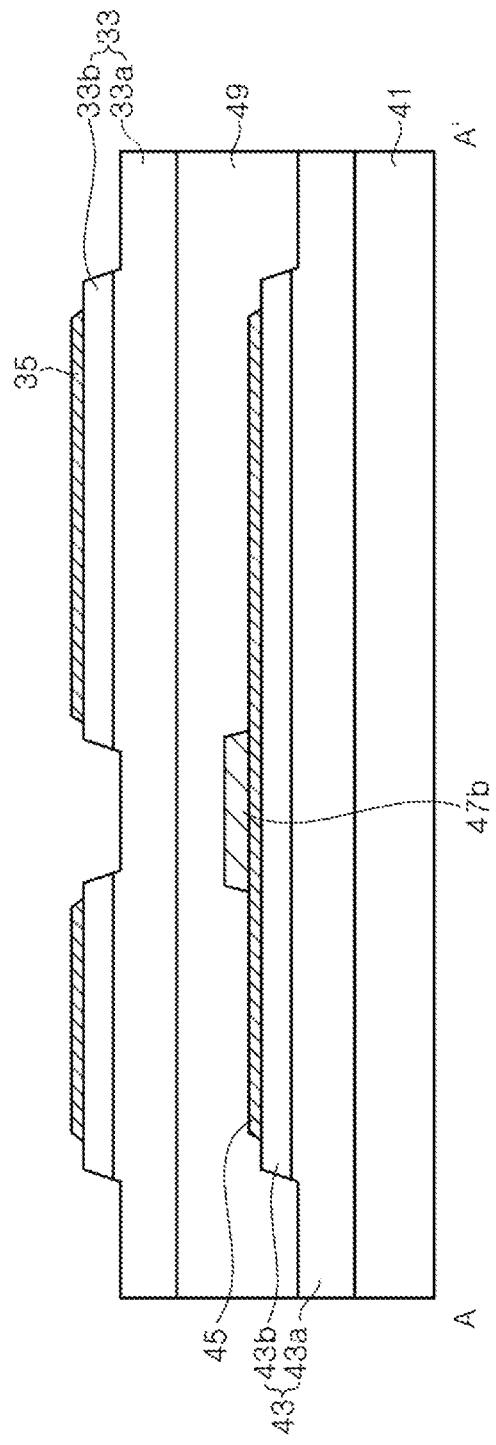
Figure 6C:
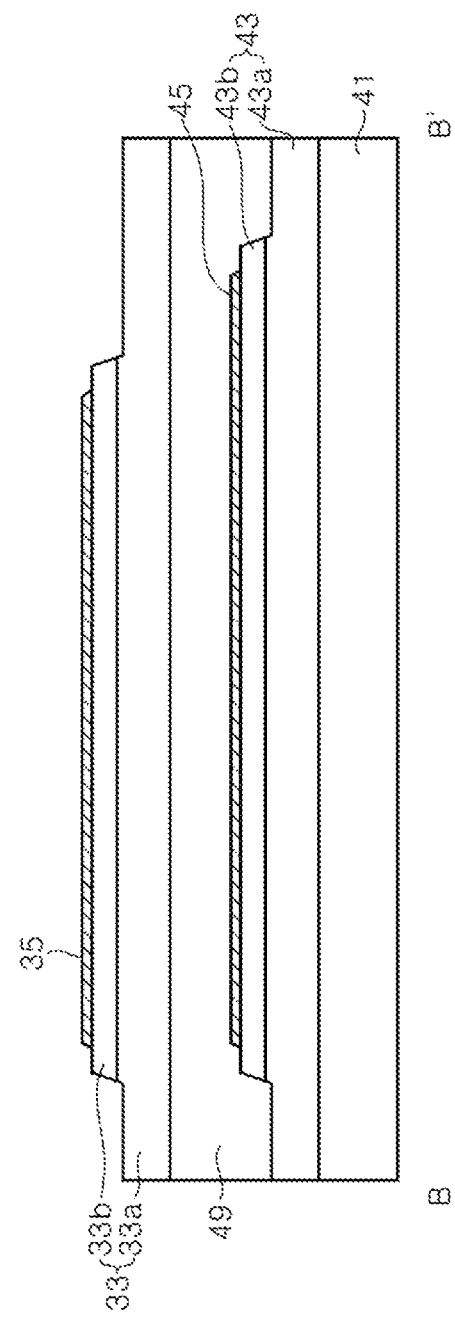
Figure 6D:
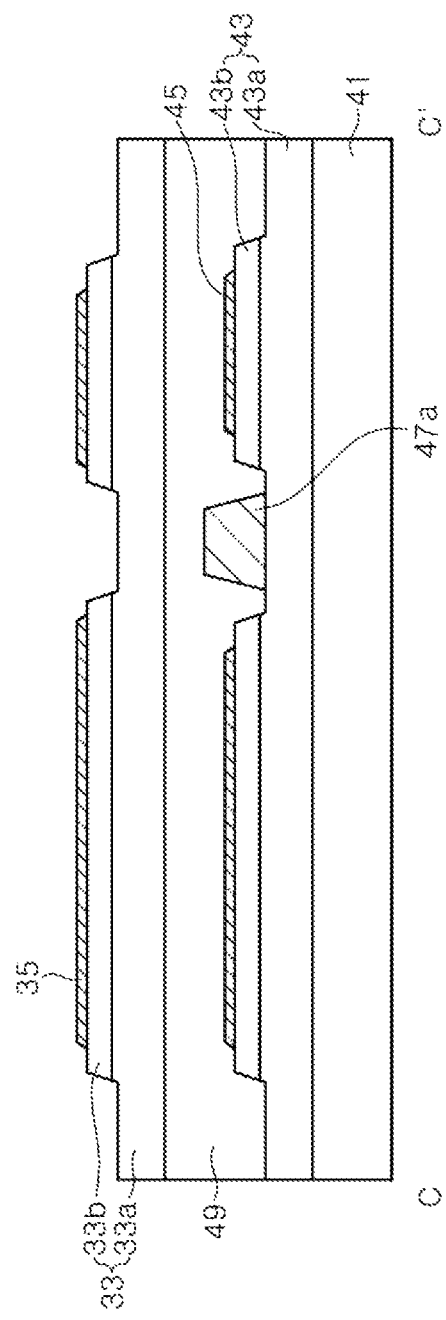
Figure 7A:
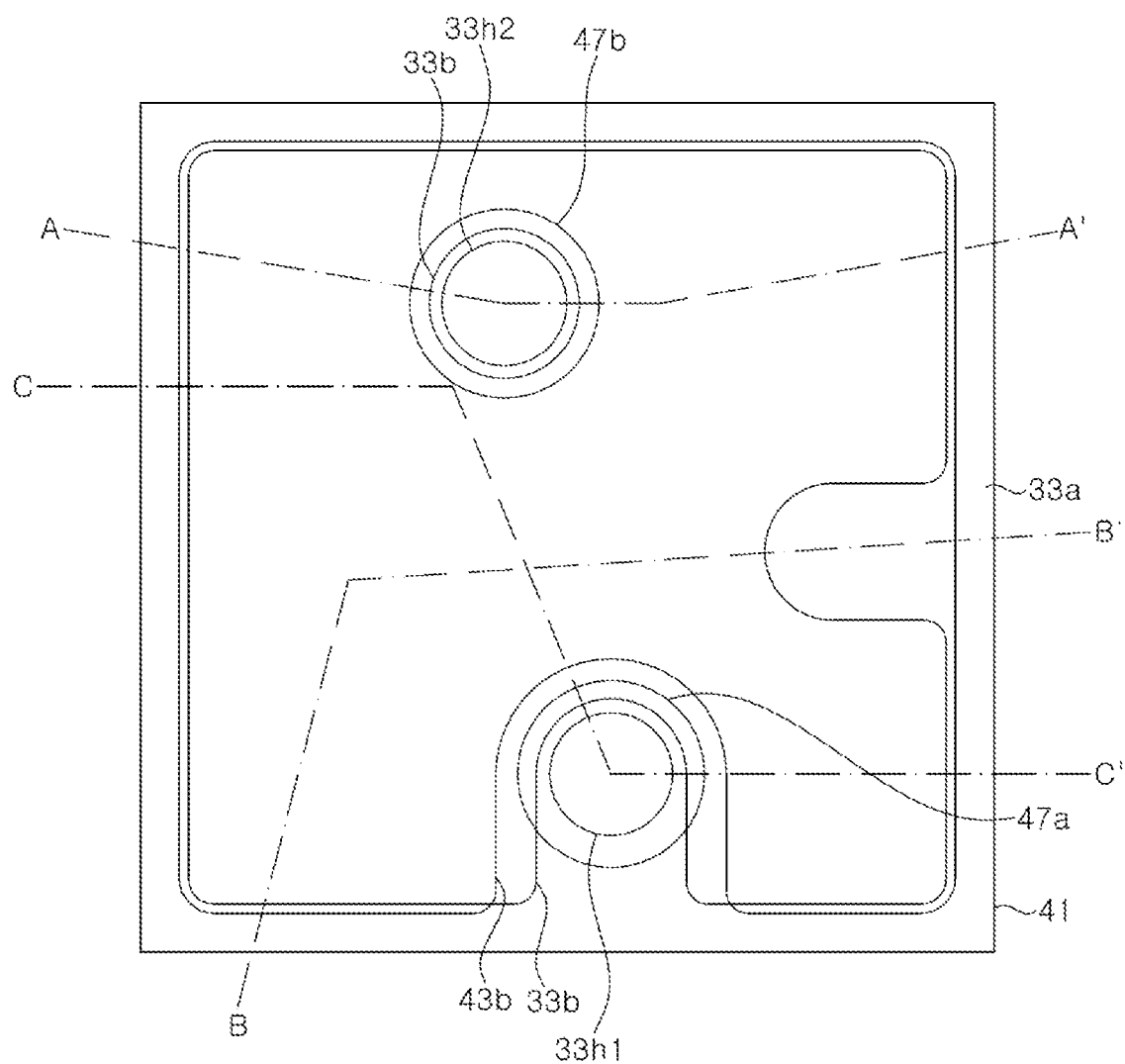
Figure 7B:
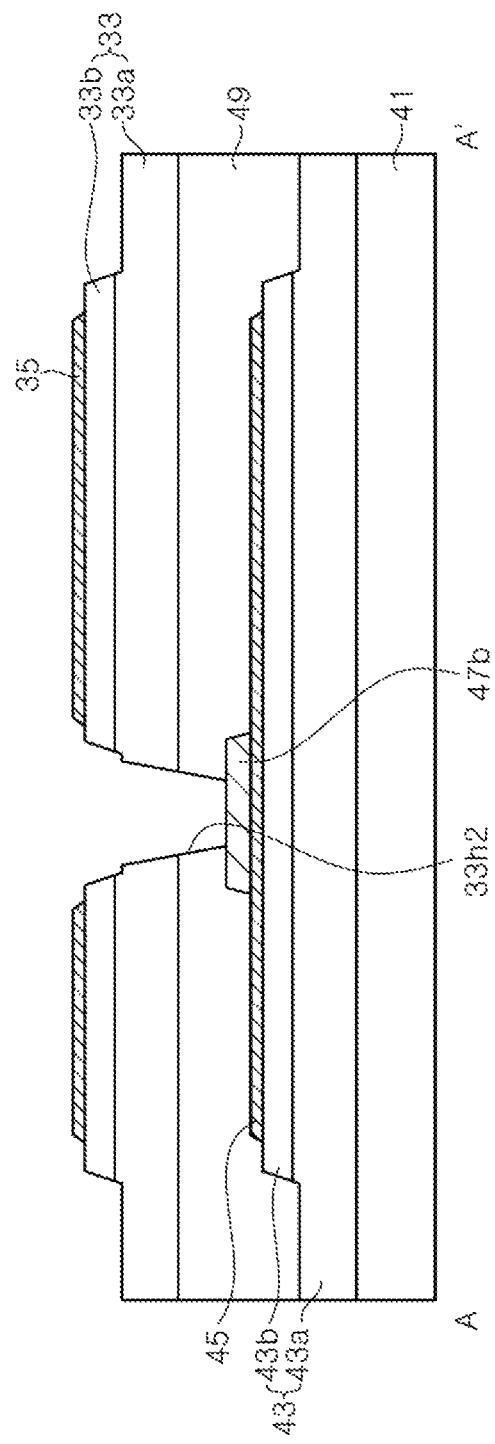
Figure 7C:
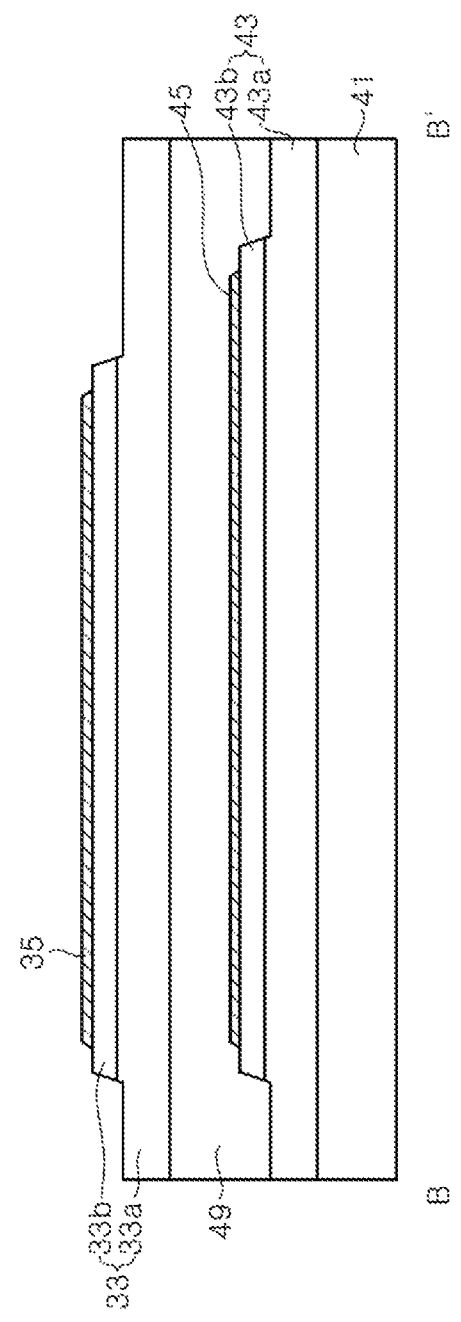
Figure 7D:
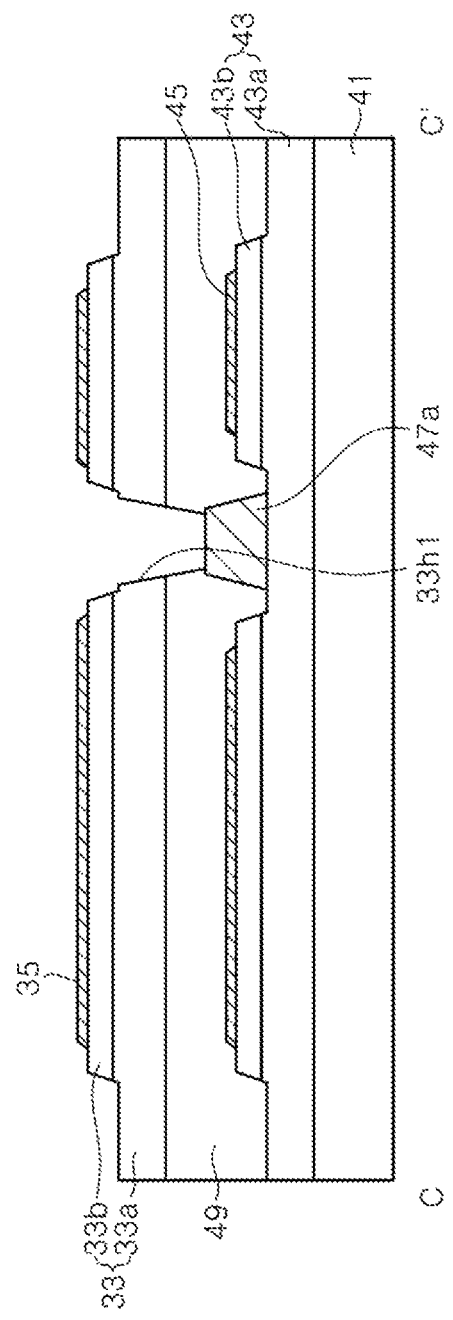
Figure 8A:
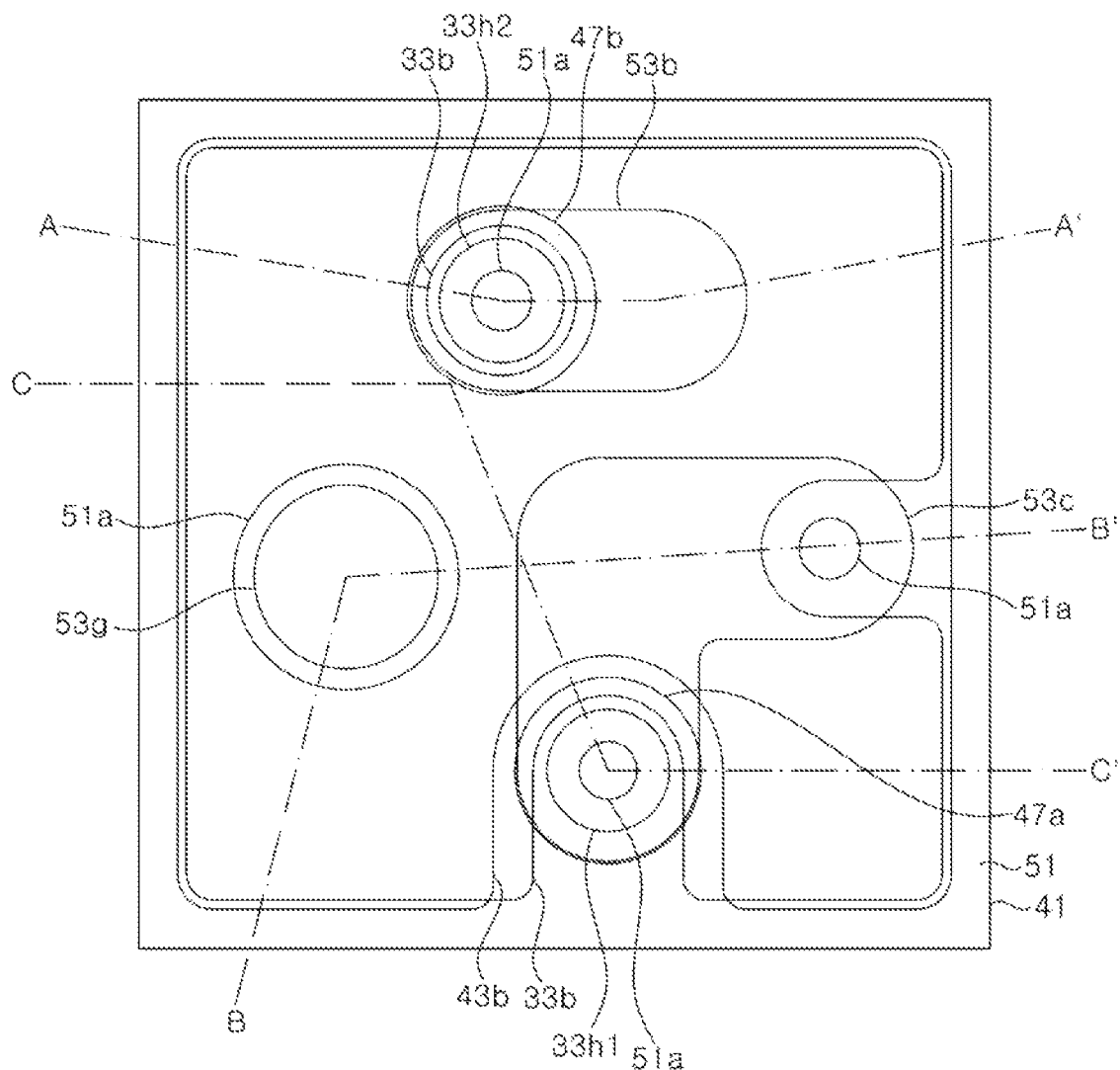
Figure 8C:
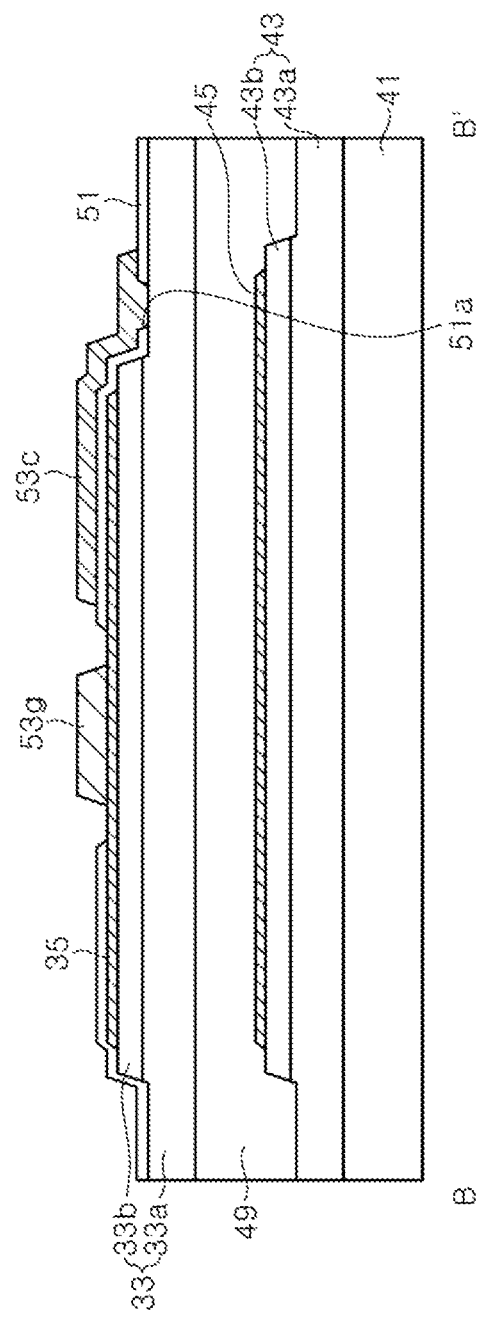
Figure 8D:
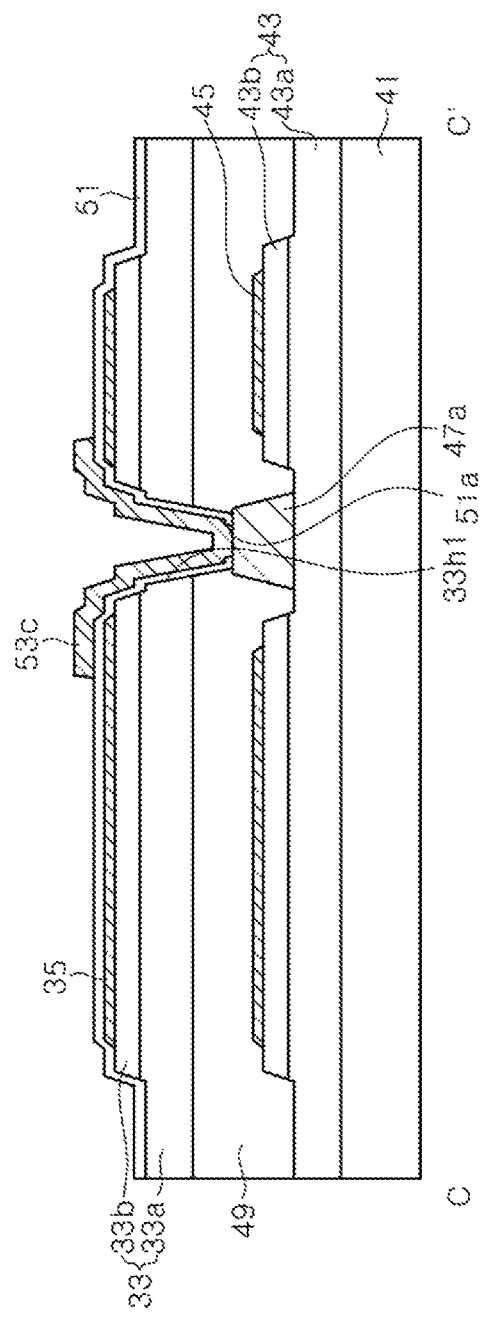
Figure 9A:
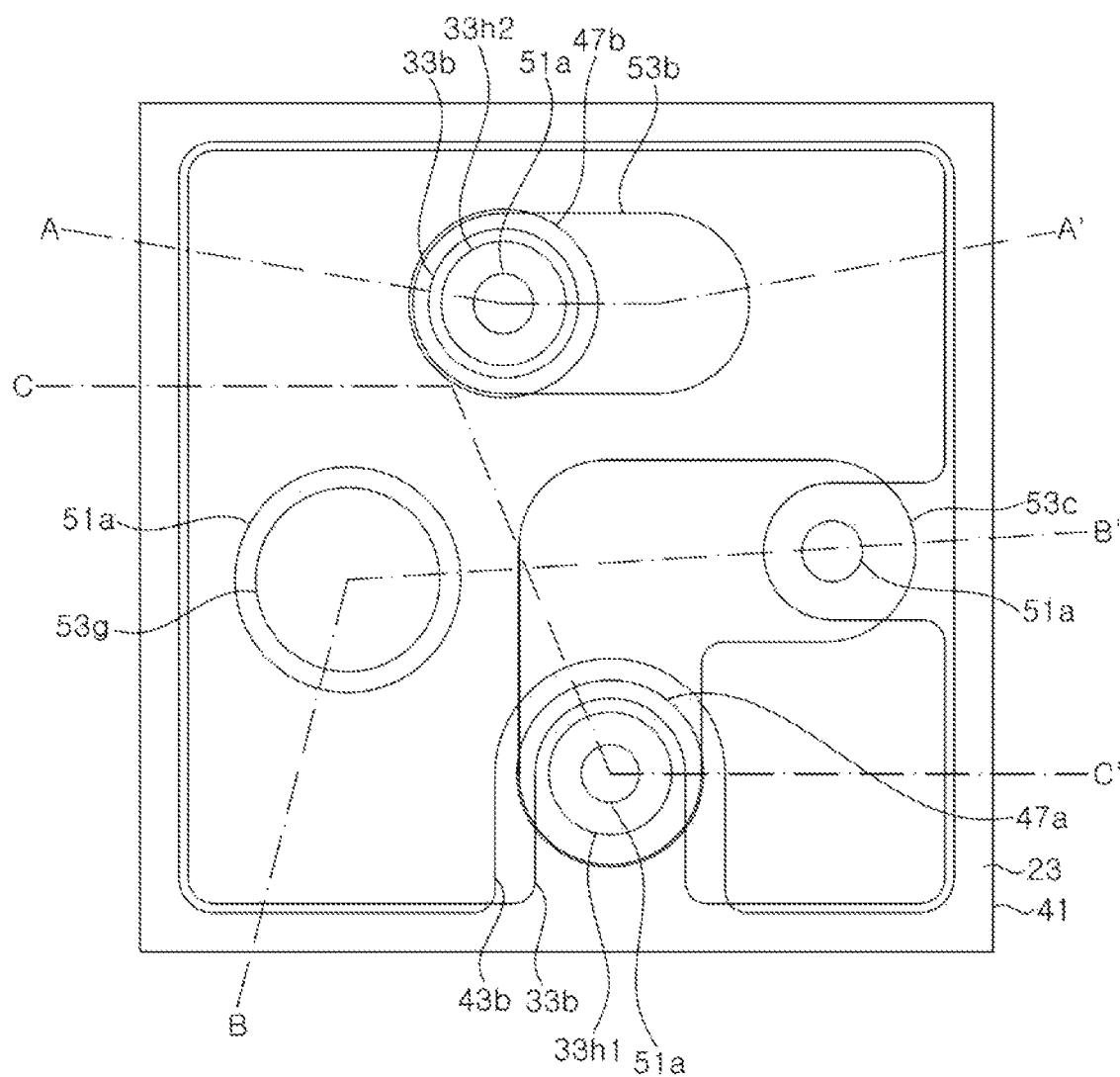
Figure 9C:
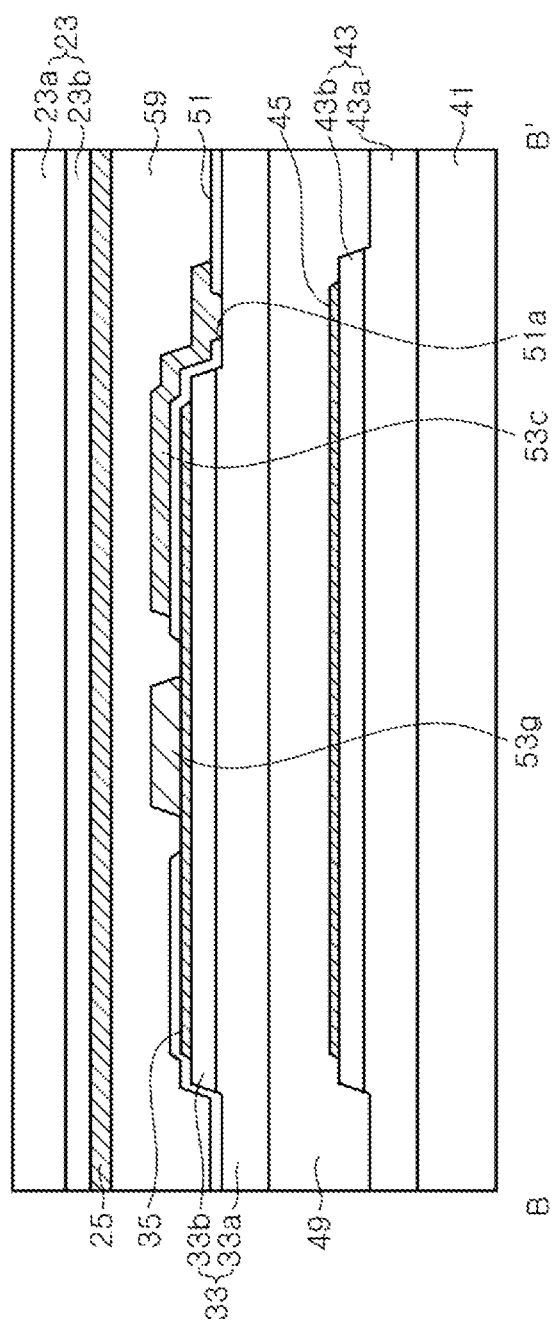
Figure 9D:
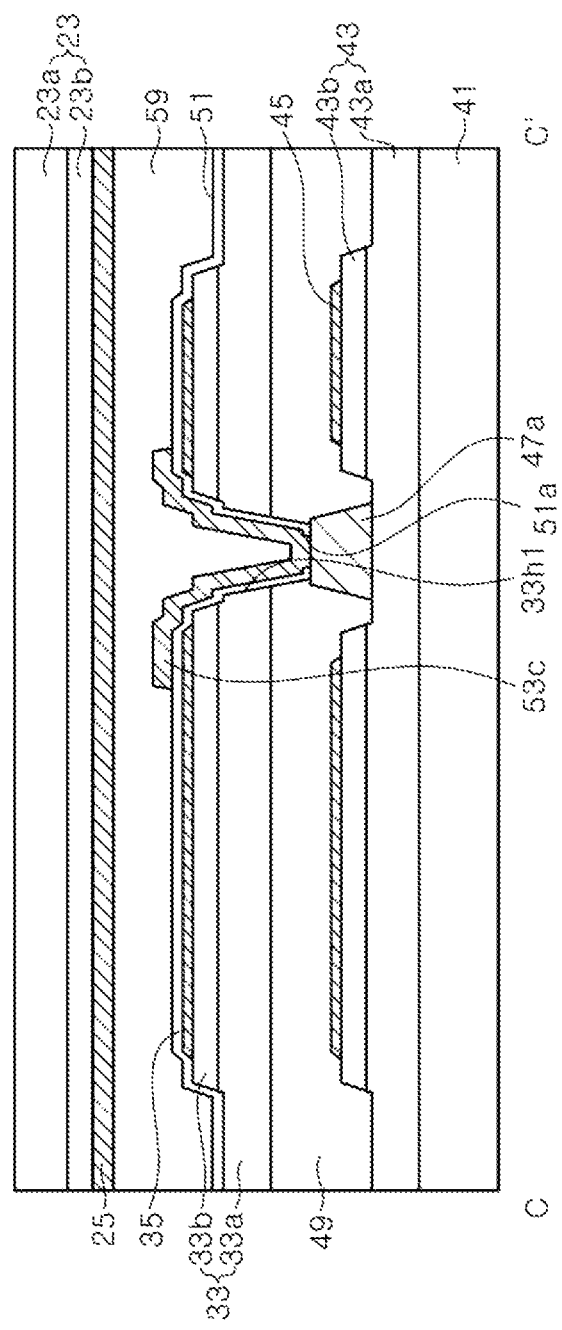
Figure 10A:
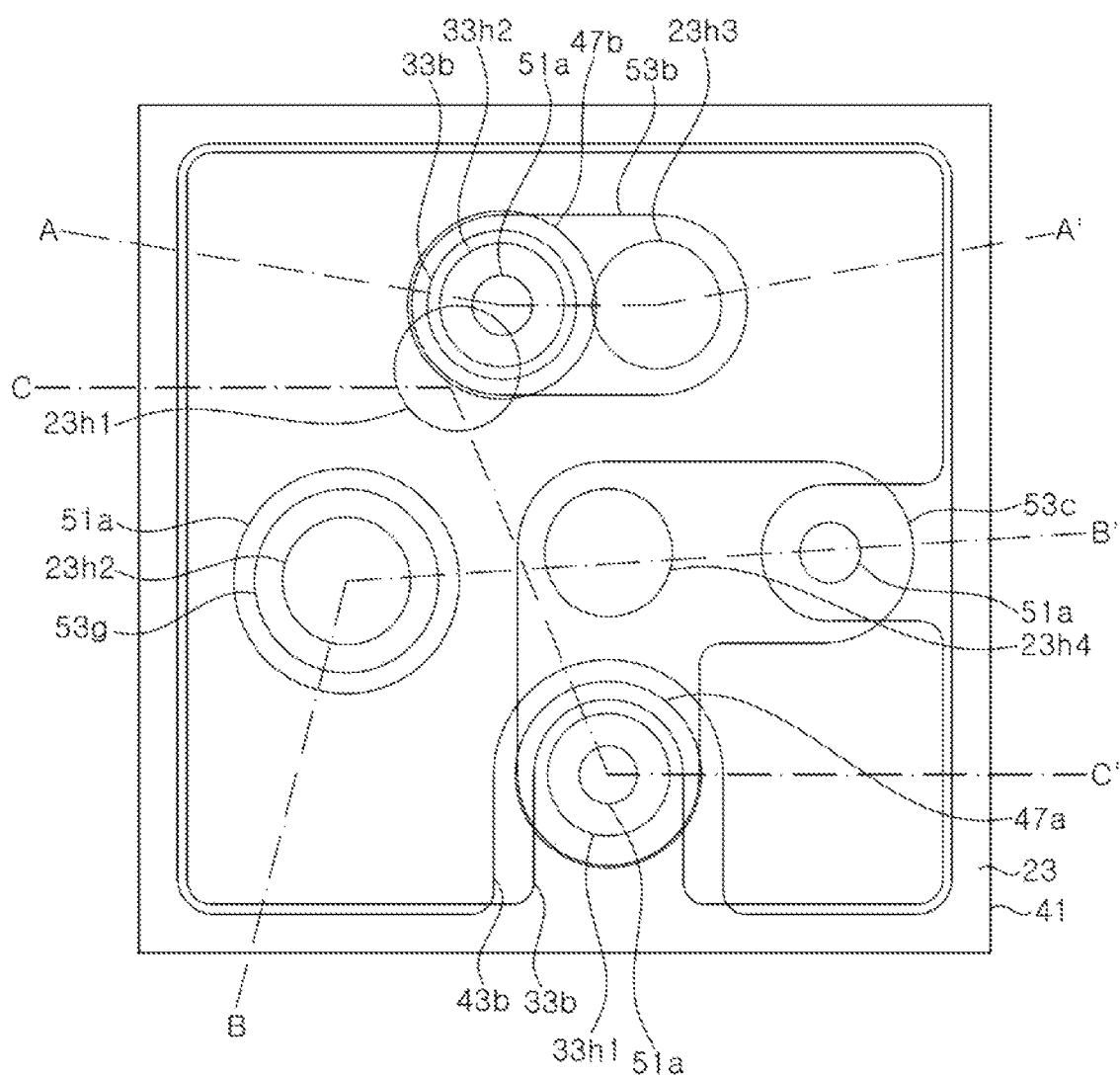
Figure 10B:
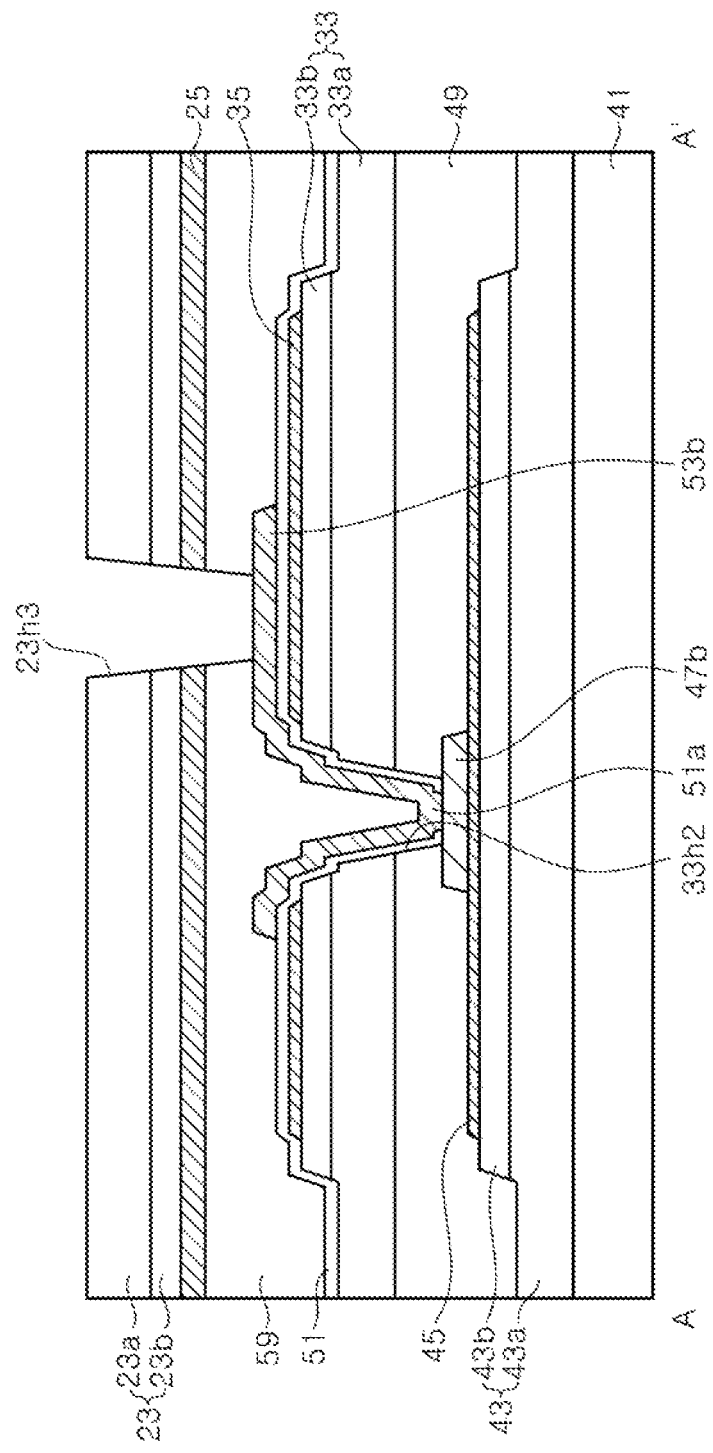
Figure 10C:
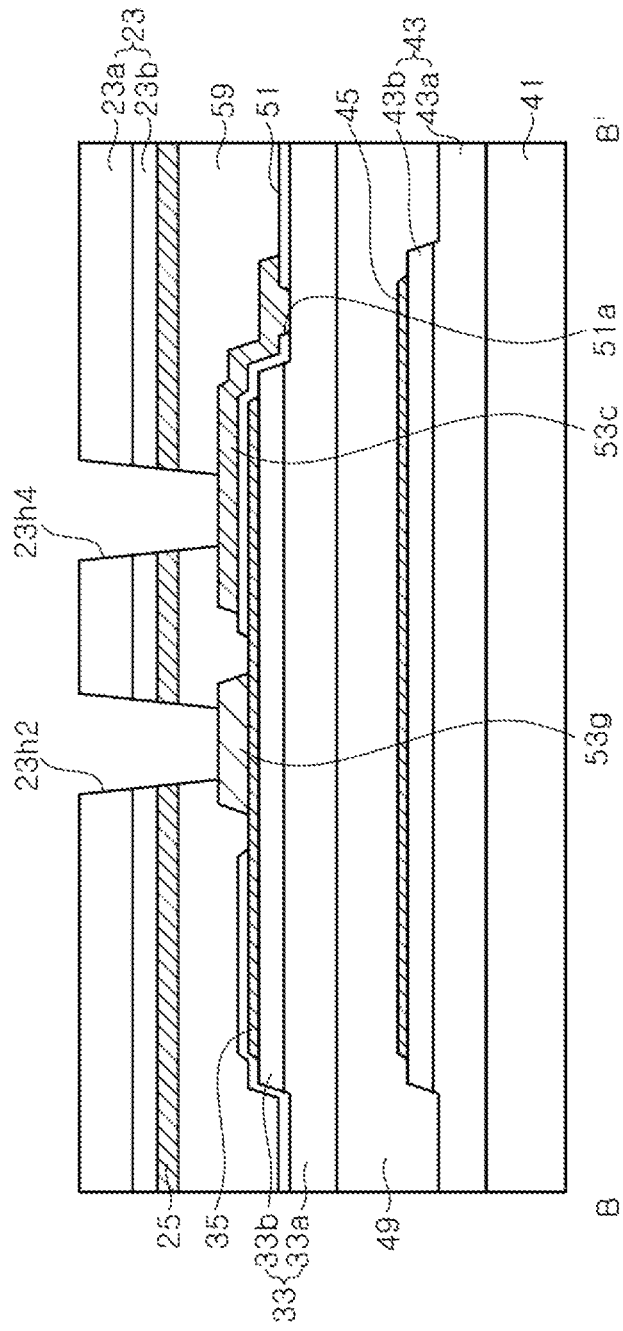
Figure 10D:
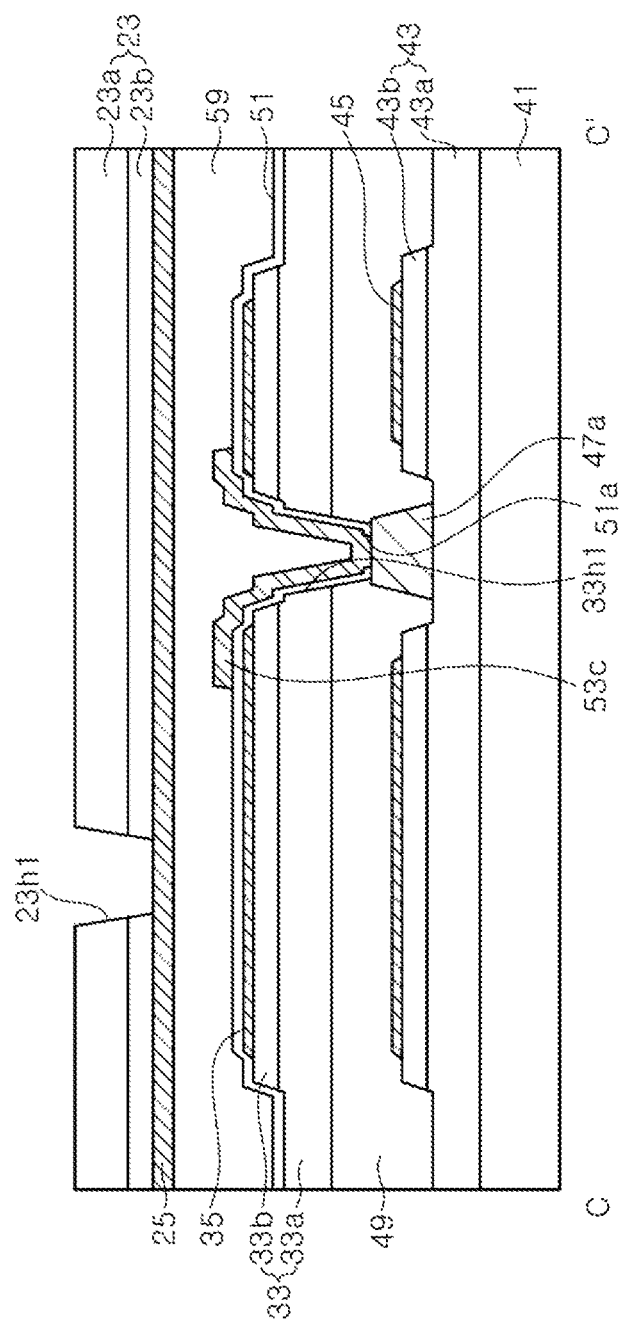
Figure 11A:
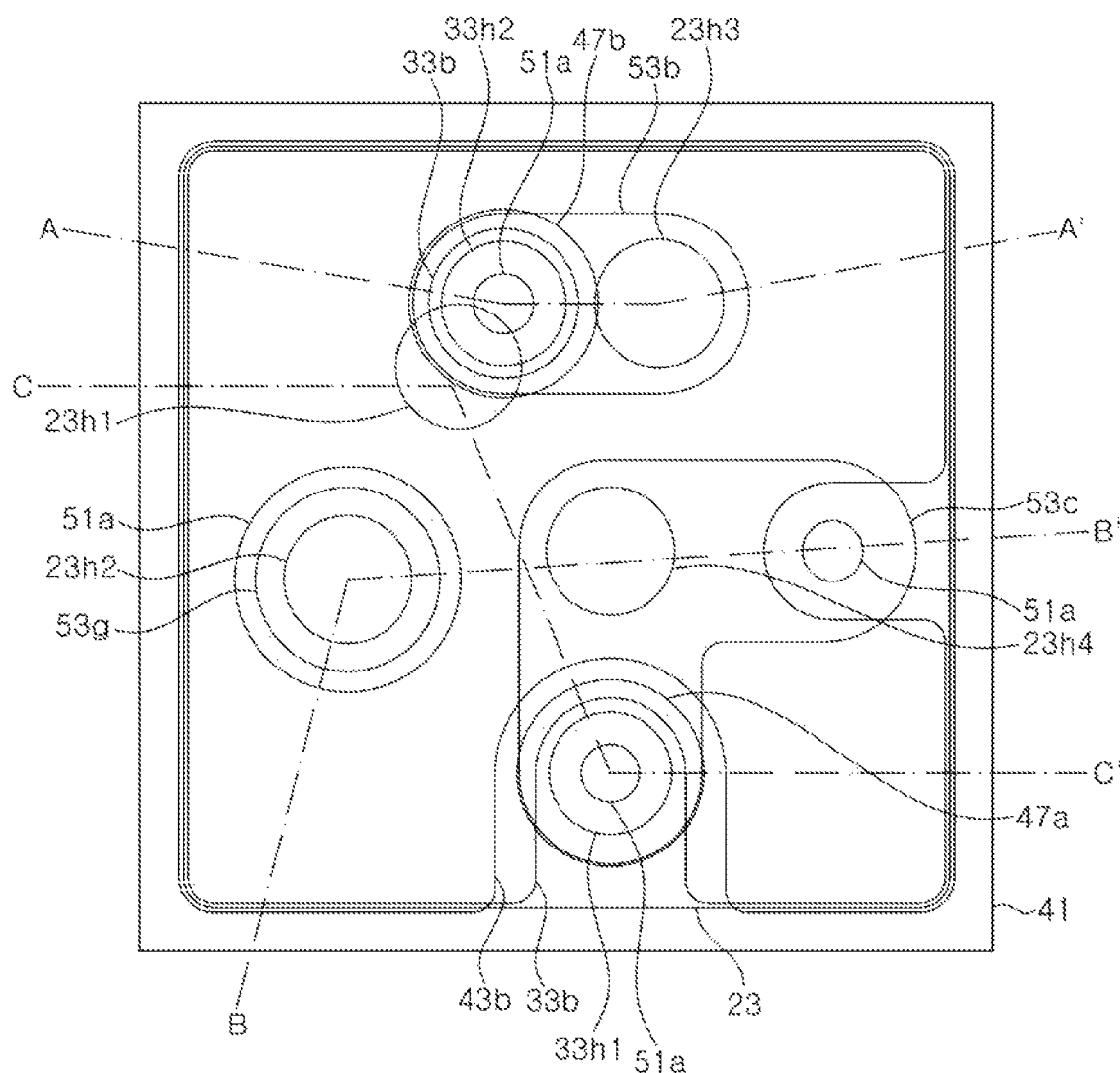
Figure 11B:
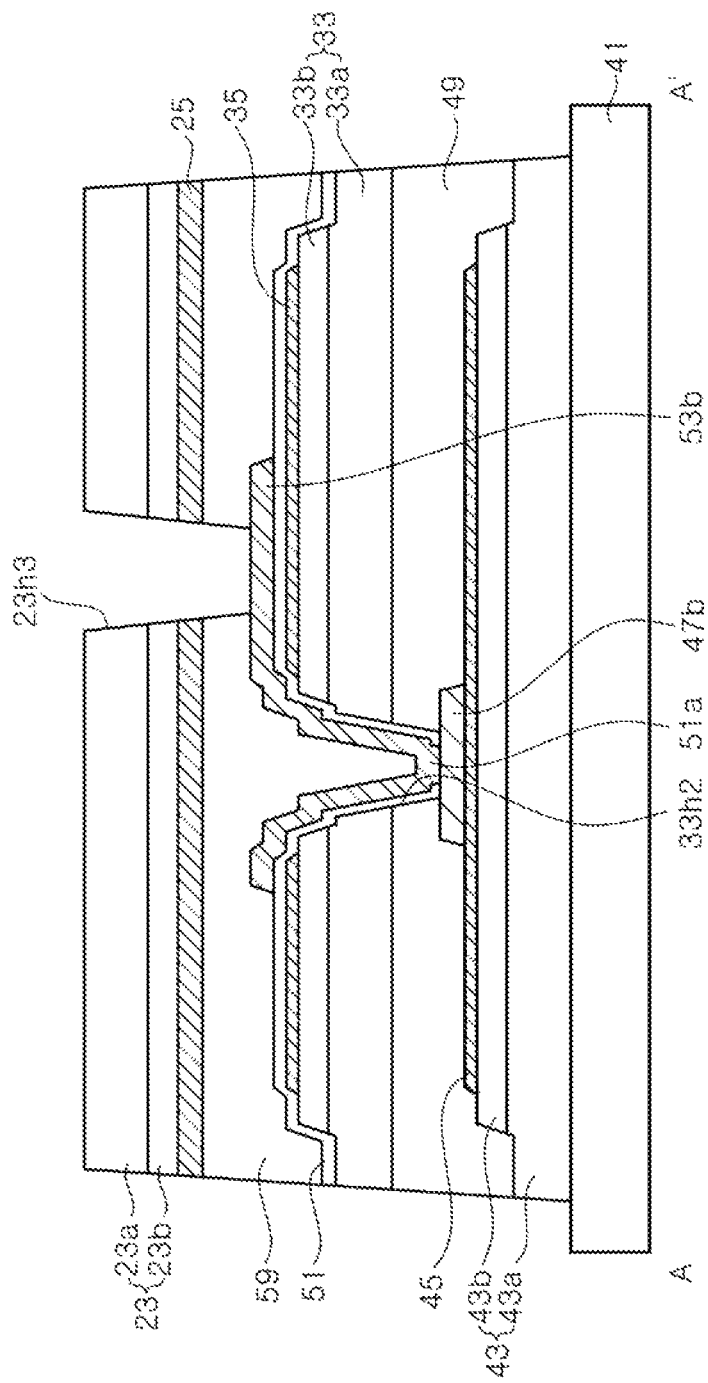
Figure 11C:
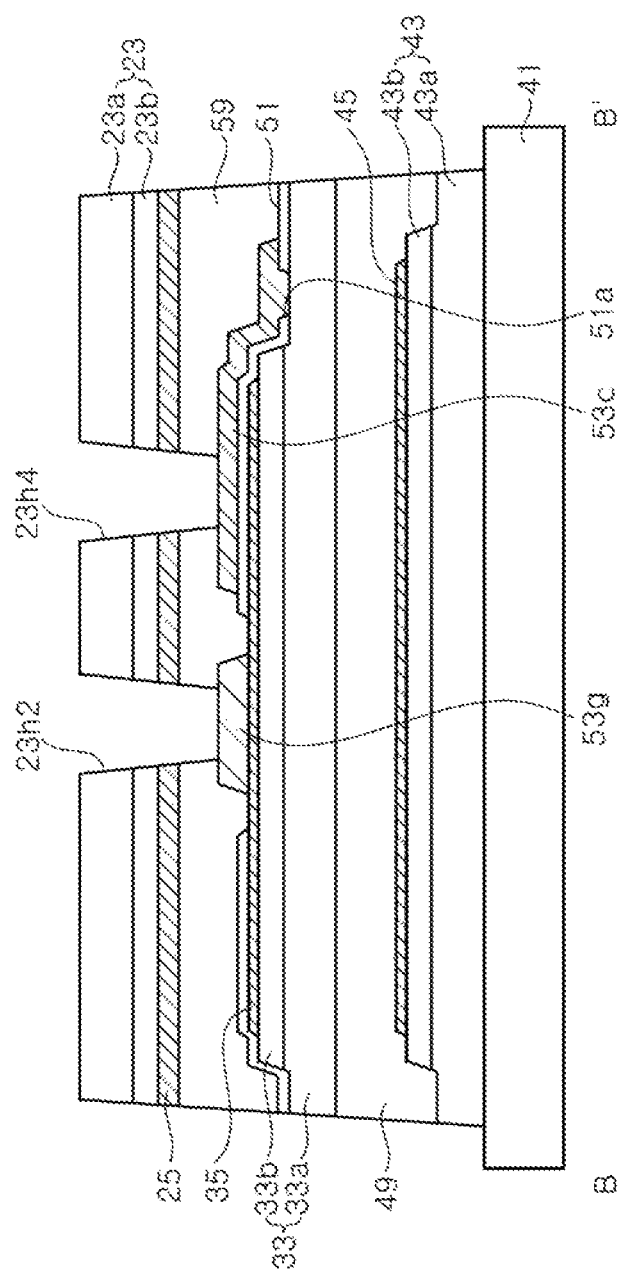
Figure 11D:
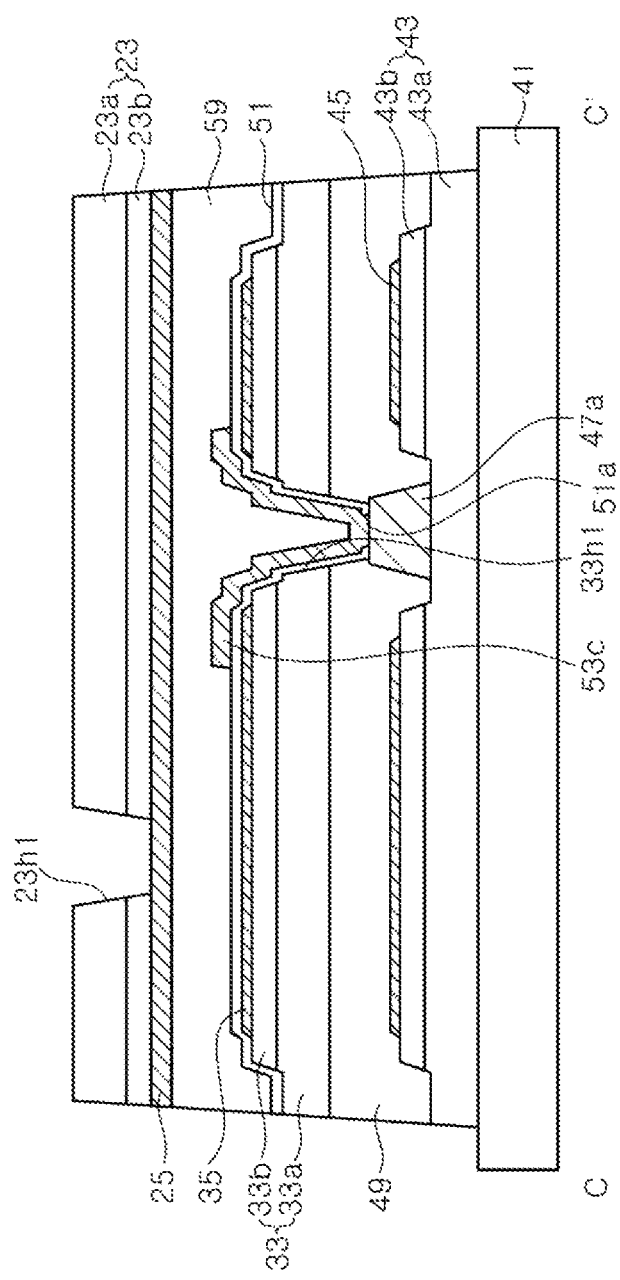
Figure 12A:
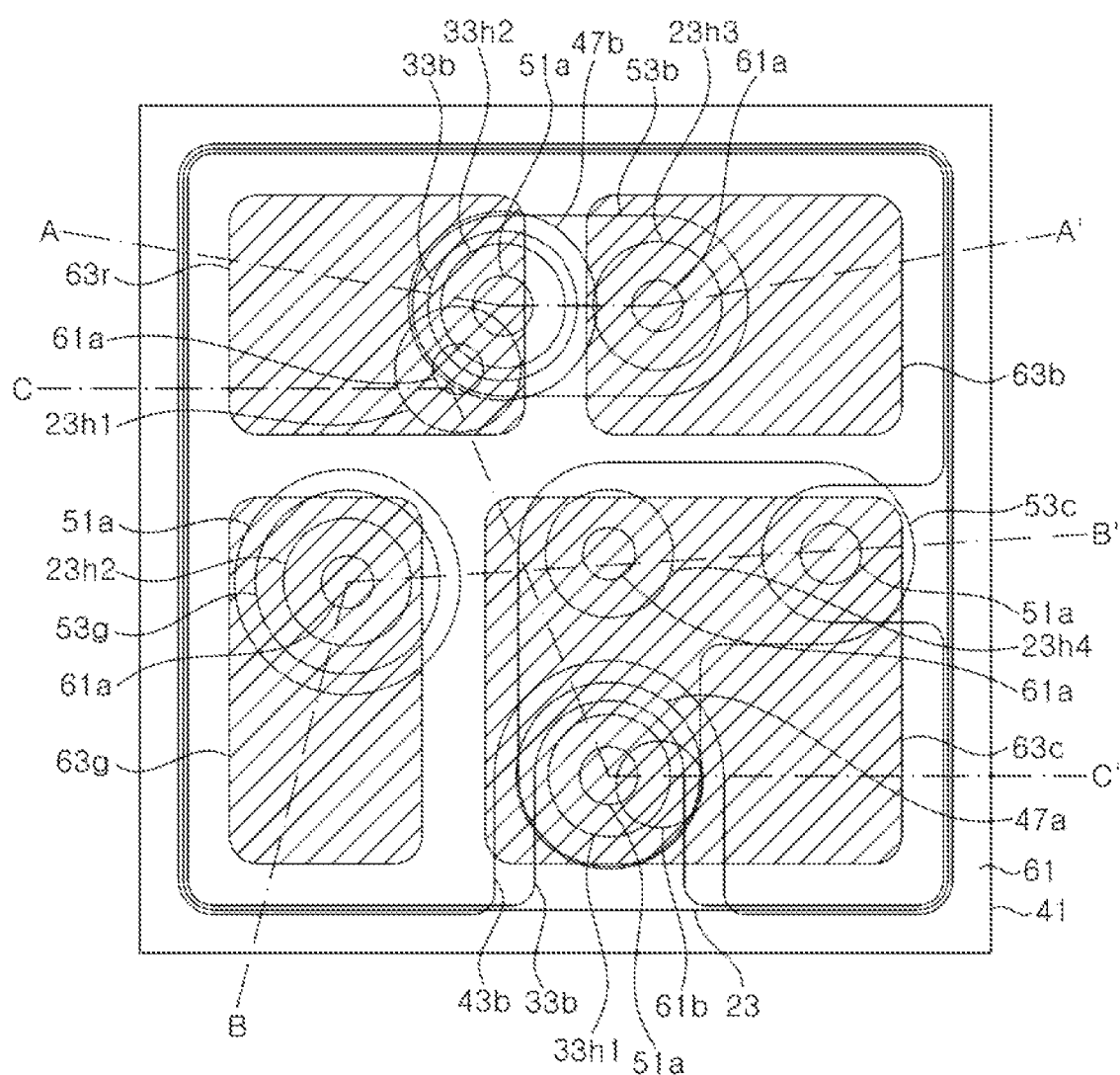
Figure 12B:
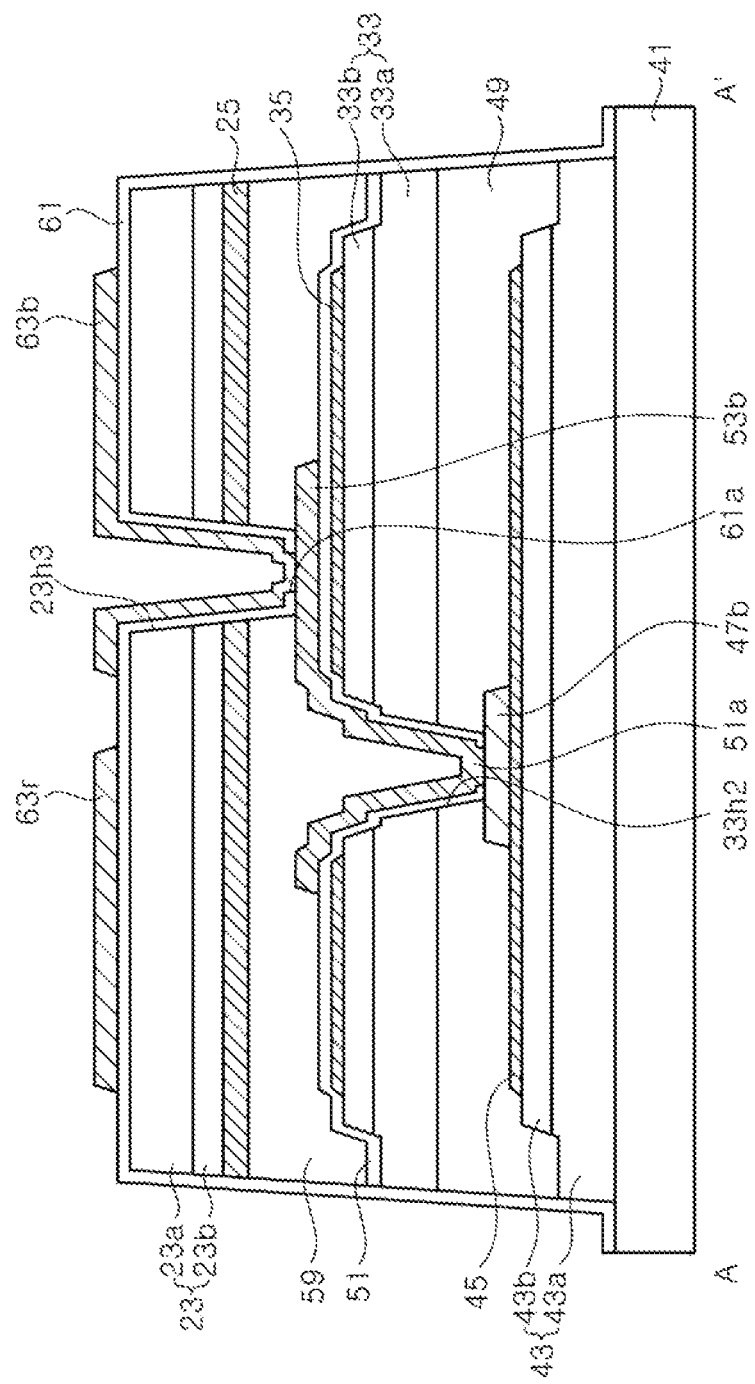
Figure 12C:
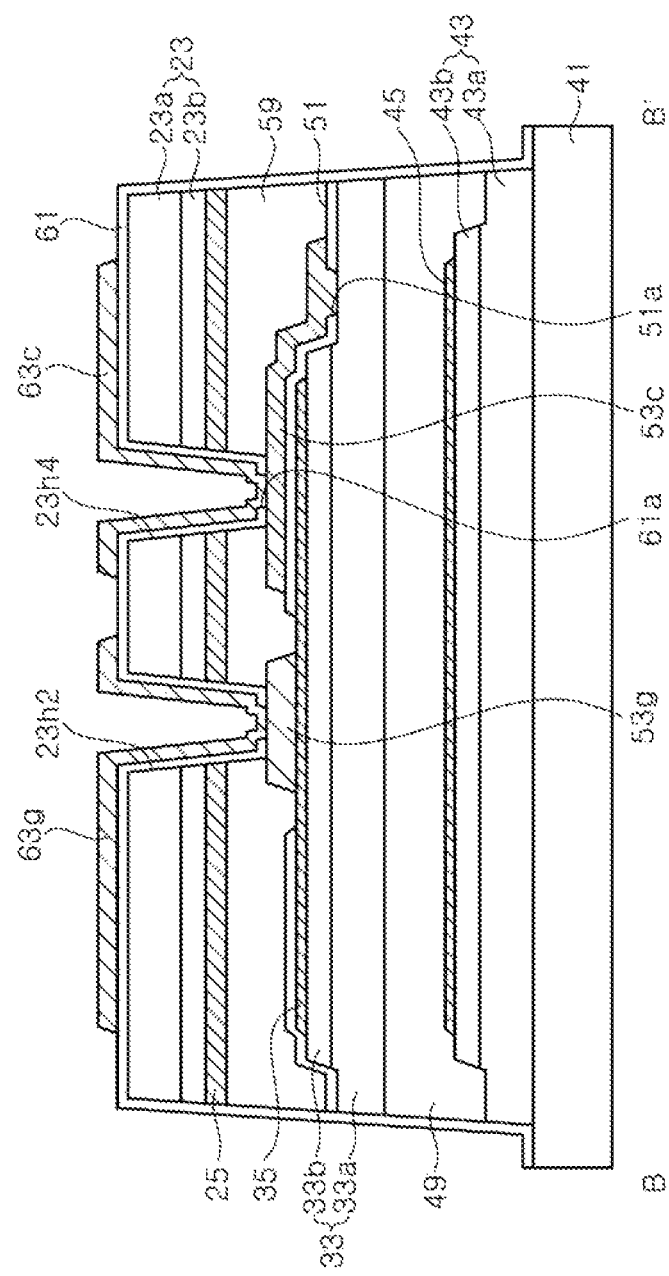
Figure 12D:
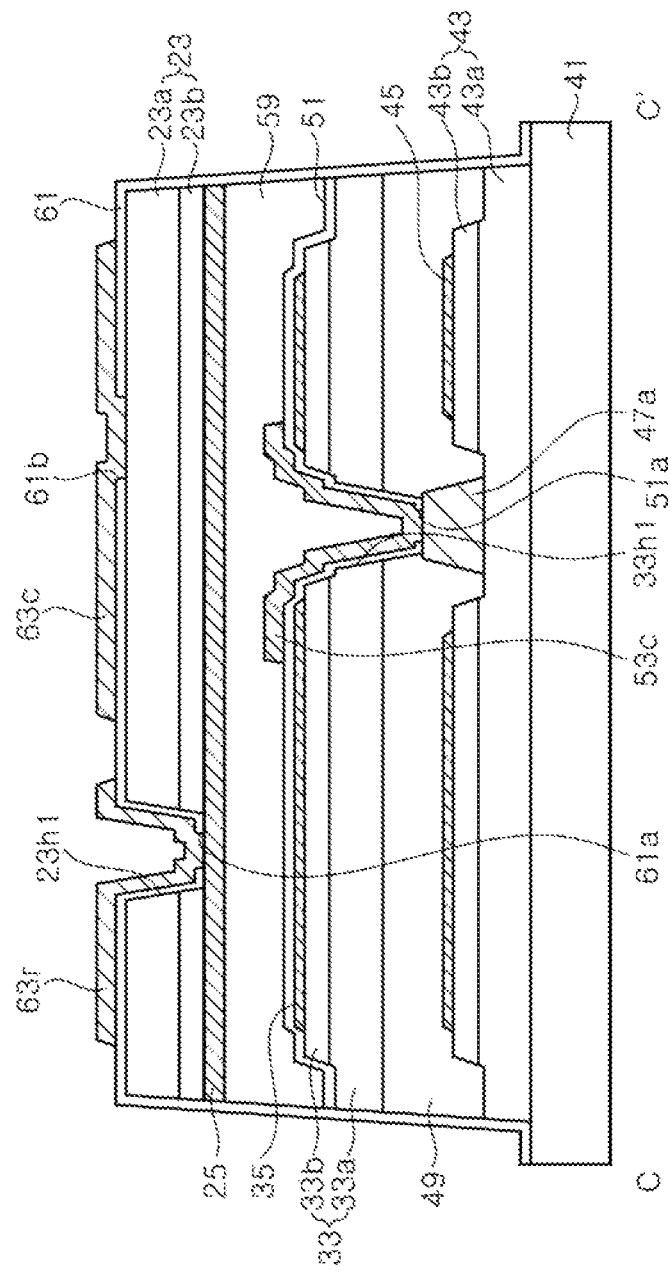

For example, after the etching mask is formed, the second transparent electrode 35 may be etched first by the wet etching technique, and then the second conductivity type semiconductor layer 33b may be etched by the dry etching technique using the same etching mask. Accordingly, the second transparent electrode 35 may be recessed from the mesa etching region. FIG. 6A exemplarily shows an edge of the mesa, and does not show an edge of the second transparent electrode 35 to simplify illustration. However, since the second transparent electrode 35 is wet etched using the same etching mask, the edge of the second transparent electrode 35 may also be recessed from the edge of the mesa toward an inner side of the mesa. In this manner, since the same etching mask is used, the number of photo processes may not be increased, thereby reducing the process costs. However, the inventive concepts are not limited thereto, and in some exemplary embodiments, the etching mask for etching the mesa etching process and the etching mask for etching the second transparent electrode 35 may be different from each other.

As shown in FIG. 6A, a mesa etching region of the second LED stack 33 may be partially overlapped with that of the third LED stack 43. For example, a portion of the mesa etching region of the second LED stack 33 may be formed over the n-electrode pad 47a. In addition, another portion of the mesa etching region thereof may be disposed over the lower p-electrode pad 47b. In addition, a portion of the mesa etching region of the second LED stack 33 may be disposed on the mesa region of the third LED stack 43.

Referring to FIG. 7A, FIG. 7B, FIG. 7C, and FIG. 7D, through holes 33h1 and 33h2 passing through the second LED stack 33 are formed. The through holes 33h1 and 33h2 pass through the first bonding layer 49 to expose the n-electrode pad 47a and the lower p-electrode pad 47b. The through holes 33h1 and 33h2 may be formed in the mesa etching region, and thus, a stepped structure may be formed on sidewalls of the through holes 33h1 and 33h2.

Since the upper surfaces of the lower p-electrode pad 47b and the n-electrode pad 47a are located at substantially the same elevation, any one of the pads may be prevented from being exposed and damaged during the formation of the through holes 33h1 and 33h2.

Referring to FIG. 8A, FIG. 8B, FIG. 8C, and FIG. 8D, a lower insulation layer 51 is formed on the second LED stack 33. The lower insulation layer 51 covers the second transparent electrode 35, and covers the second conductivity type semiconductor layer 33b. In addition, the lower insulation layer 51 covers the sidewalls of the through holes 33h1 and 33h2. The lower insulation layer 51 may have openings 51a exposing the second transparent electrode 35, the first conductivity type semiconductor layer 33a, the n-electrode pad 47a and the lower p-electrode pad 47b.

Subsequently, a lower common connector 53c, a lower p-connector 53b, and an upper p-electrode pad 53g are formed on the lower insulation layer 51. The lower common connector 53c, the lower p-connector 53b, and the upper p-electrode pad 53g may be formed together with the same material.

An upper p-electrode pad 53g may be disposed on the second transparent electrode 35 exposed in the opening 51a. The lower p-connector 53b is connected to the lower p-electrode pad 47b exposed through the opening 51a, and is also partially disposed on the lower insulation layer 51. The lower common connector 53c is connected to the first conductivity type semiconductor layer 33a and the n-electrode pad 47a exposed through the openings 51a, and a portion of the lower common connector 53c is disposed on the lower insulation layer 51.

Referring to FIG. 9A, FIG. 9B, FIG. 9C and FIG. 9D, the first LED stack 23 of FIG. 4A is bonded to the second LED stack 33. The first LED stack 23 and the second LED stack 33 may be bonded using a second bonding layer 59, so that the first transparent electrode 25 faces the second LED stack 33. Accordingly, the second bonding layer 59 is in contact with the first transparent electrode 25, and also is in contact with the lower insulation layer 51, the lower p-connector 53b, the upper p-electrode pad 53g, and the lower common connector 53c, and, further, in contact with the second transparent electrode 35 exposed in a periphery of the lower p-connector 53b. The first substrate 21 is removed from the first LED stack 23. The first substrate 21 may be removed using, for example, an etching technique.

Referring to FIG. 10A, FIG. 10B, FIG. 10C, and FIG. 10D, through holes 23h1, 23h2, 23h3, and 23h4 passing through the first LED stack 23 are formed. The through hole 23h1 exposes the first transparent electrode 25, and the through holes 23h2, 23h3, and 23h4 pass through the second bonding layer 59 to expose the upper p-electrode pad 53g, the lower p-connector 53b, and the lower common connector 53c, respectively. Since the through holes 23h1 and the through holes 23h2, 23h3, and 23h4 have different depths, they may be formed by different processes. Meanwhile, the through holes 23h2, 23h3, and 23h4 may be formed together in the same process because the depths thereof are substantially the same.

The through holes 23h1, 23h2, 23h3, and 23h4 may be formed to pass through the first LED stack 23, and thus, sidewalls of the through holes may be formed without steps, unlike those of the through holes 33h1 and 33h2.

Referring to FIG. 11A, FIG. 11B, FIG. 11C, and FIG. 11D, an isolation trench is formed to define a region of the light emitting device 100 by an isolation process. The isolation trench may expose the third substrate 41 along peripheries of the first to third LED stacks 23, 33, and 43. Between regions of the light emitting device, the isolation trench may be formed by sequentially removing the first LED stack 23, the first transparent electrode 25, the second bonding layer 59, the lower insulation layer 51, the second LED stack 33, the first bonding layer 49, and the third LED stack 43. The second transparent electrode 35 and the third transparent electrode 45 are not exposed during the isolation process, and thus, the second transparent electrode 35 and the third transparent electrode 45 may not be damaged by etching gas. When the second and third transparent electrodes 35 and 45 are formed of ZnO, ZnO may be easily damaged by etching gas. However, according to the illustrated exemplary embodiment, the second transparent electrode 35 and the third transparent electrode 45 may be prevented from being exposed to an etching gas by forming the second and third transparent electrodes 35 and 45 to be recessed inwardly.

In the illustrated exemplary embodiment, the first to third LED stacks 23, 33, and 43 are described as being sequentially patterned through the isolation process, but the inventive concepts are not limited thereto. For example, in some exemplary embodiments, the third LED stack 43 may be removed in advance in a region where the isolation trench will be formed before bonding the second LED stack 33, or the second LED stack 33 may be removed in advance in the region in which the isolation trench will be formed before bonding the first LED stack 23. In this case, the region where the third LED stack 43 is removed may be filled with the first bonding layer 49, and the region where the second LED stack 33 is removed may be filled with the second bonding layer 59. Accordingly, the second and third LED stacks 33 and 43 may not be exposed in the isolation process.

Referring to FIG. 12A, FIG. 12B, FIG. 12C, and FIG. 12D, an intermediate insulation layer 61 is formed on the first LED stack 23. The intermediate insulation layer 61 may cover side surfaces of the first to third LED stacks 23, 33, and 43, side surfaces of the first and second bonding layers 49 and 59, a side surface of the transparent electrode 25, and a side surface of the lower insulation layer 51 exposed through the isolation trench.

The intermediate insulation layer 61 may also cover sidewalls of the through holes 23h1, 23h2, 23h3, and 23h4. However, the intermediate insulation layer 61 is patterned to have openings 61a exposing bottoms of the through holes 23h1, 23h2, 23h3, and 23h4, and an opening 61b exposing the first conductivity type semiconductor layer 23a of the first LED stack 23. The openings 61a expose the first transparent electrode 25, the upper p-electrode pad 53g, the lower p-connector 53b, and the lower common connector 53c in the through holes 23h1, 23h2, 23h3, and 23h4.

First to third upper connectors 63r, 63g, and 63b, and an upper common connector 63c are formed on the intermediate insulation layer 61. The first upper connector 63r is connected to the first transparent electrode 25, the second upper connector 63g is connected to the upper p-electrode pad 53g, and the third upper connector 63b is connected to the lower p-connector 53b. The upper common connector 63c may be connected to the lower common connector 53c.

Referring to FIG. 13A, FIG. 13B, FIG. 13C, and FIG. 13D, an upper insulation layer 71 is formed to cover the intermediate insulation layer 61 and the connectors 63r, 63g, 63b, and 63c. The upper insulation layer 71 may also cover the intermediate insulation layer 61 on the side surfaces of the first to third LED stacks 23, 33, and 43. However, the upper insulation layer 71 may be patterned to have openings 71a exposing the first to third upper connectors 63r, 63g, and 63b, and the upper common connector 63c.

Subsequently, bump pads 73r, 73g, 73b, and 73c are formed in the openings 71a, respectively. The first bump pad 73r is disposed on the first upper connector 63r, the second bump pad 73g is disposed on the second upper connector 63g, and the third bump pad 73b is disposed on the third upper connector 63b. The common bump pad 73c is disposed on the upper common connector 63c.

Then, the light emitting device 100 is bonded onto a circuit board 101 (see FIG. 14), and the third substrate 41 may be separated to from the light emitting device 100. A schematic cross-sectional view of the light emitting device 100 bonded to the circuit board 101 is exemplarily shown in FIG. 14.

Figure 14:
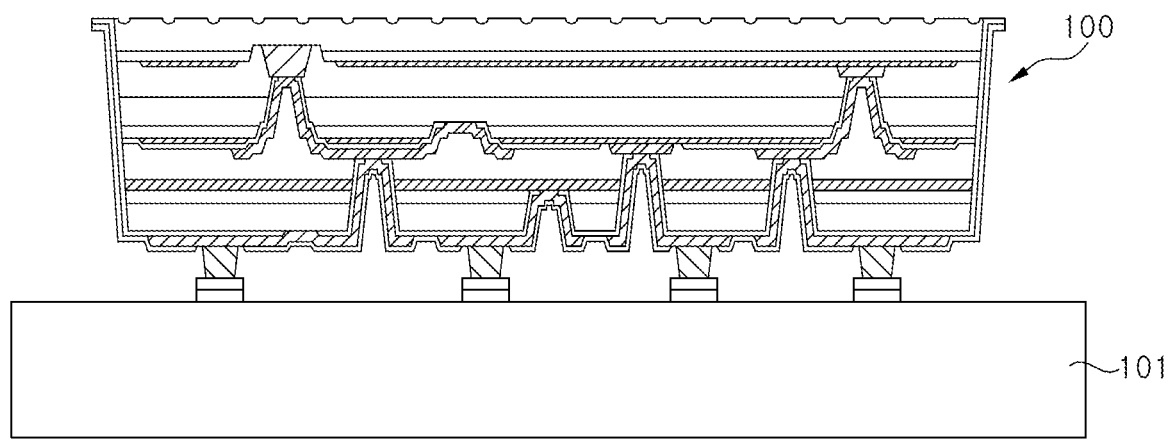
FIG. 14 is a schematic cross-sectional view illustrating a light emitting device mounted on a circuit board according to an exemplary embodiment.

Although FIG. 14 exemplarily illustrates a single light emitting device 100 disposed on the circuit board 101, however, a plurality of light emitting devices 100 may be mounted on the circuit board 101. Each of the light emitting devices 100 may form one pixel capable of emitting any one of blue light, green light, and red light, and a plurality of pixels are arranged on the circuit board 101 to provide a display panel.

Figure 15A:
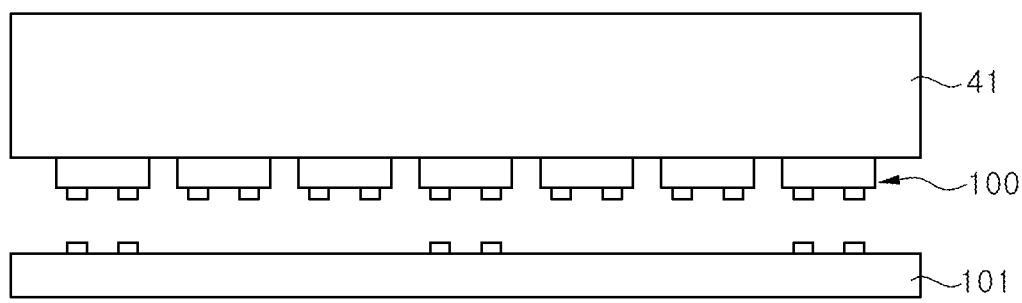
FIG. 15A, FIG. 15B, and FIG. 15C are schematic cross-sectional views illustrating a method of transferring a light emitting device to a circuit board according to an exemplary embodiment.
Figure 15B:
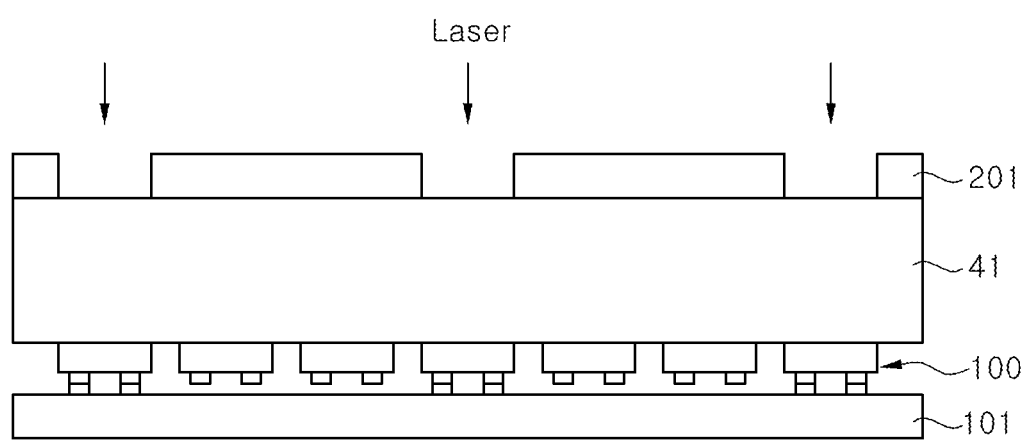
Figure 15C:
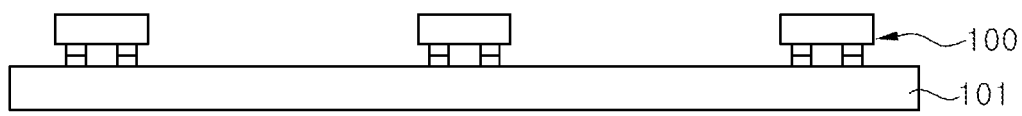

The plurality of light emitting devices 100 may be formed on the substrate 41, and the light emitting devices 100 may be transferred onto the circuit board 101 in a group, not individually. FIG. 15A, FIG. 15B, and FIG. 15C are schematic cross-sectional views illustrating a method of transferring the light emitting device to the circuit board according to an exemplary embodiment. Hereinafter, a method of transferring the light emitting devices 100 formed on the substrate 41 to the circuit board 101 in a group will be described.

Figure 13A:
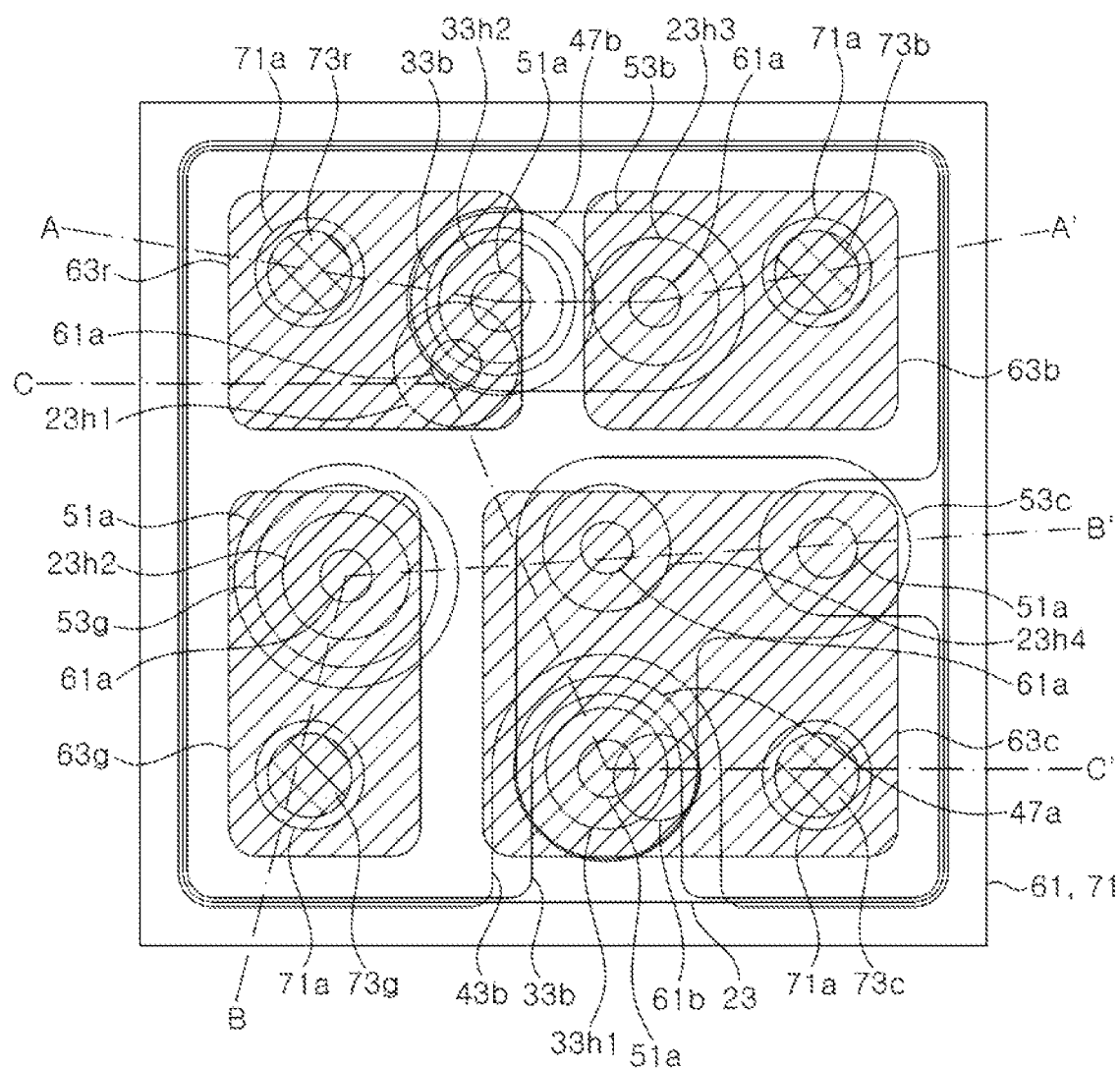
Figure 13B:
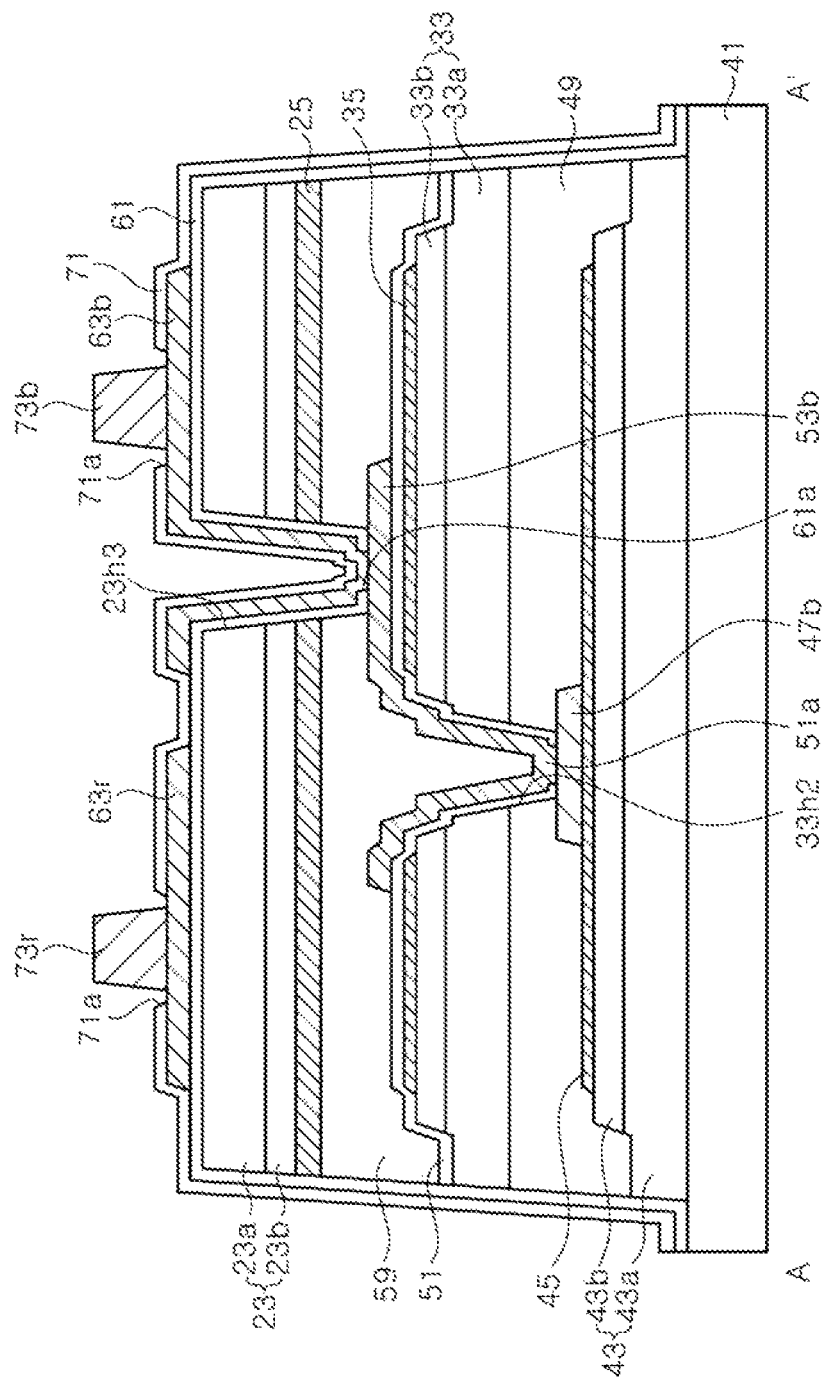
Figure 13C:
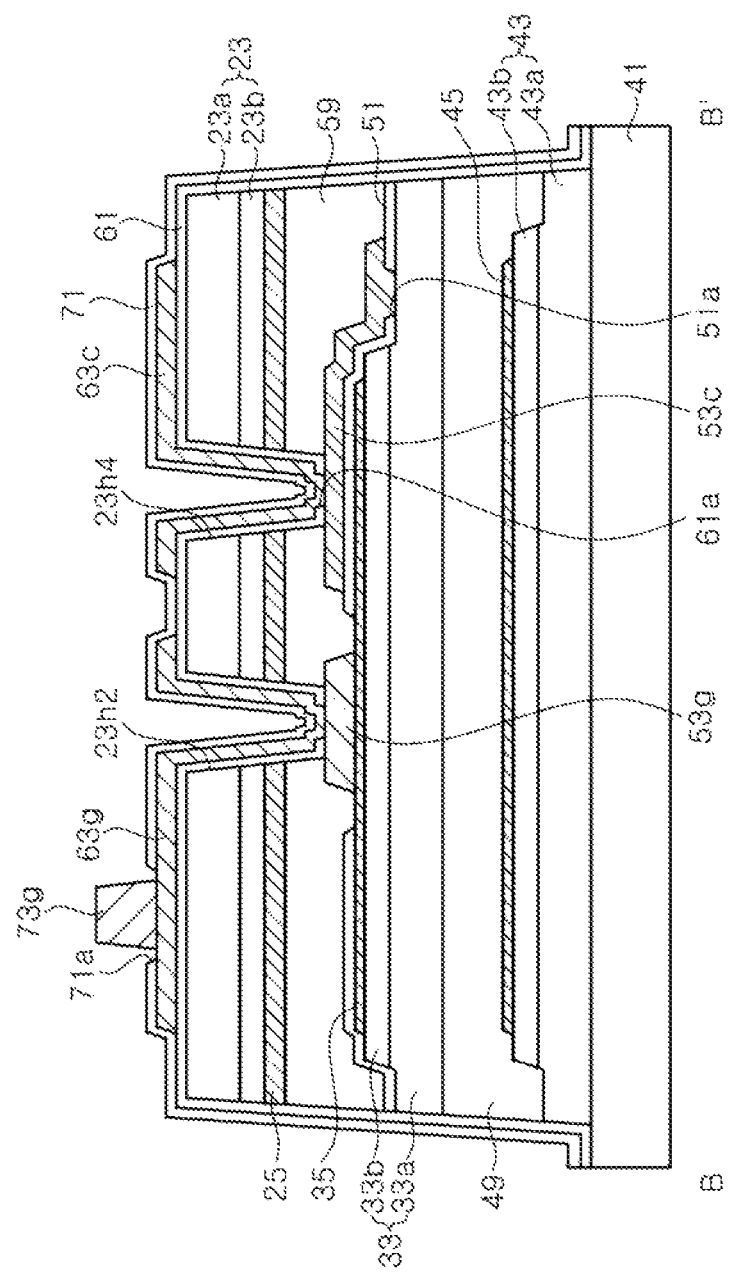
Figure 13D:
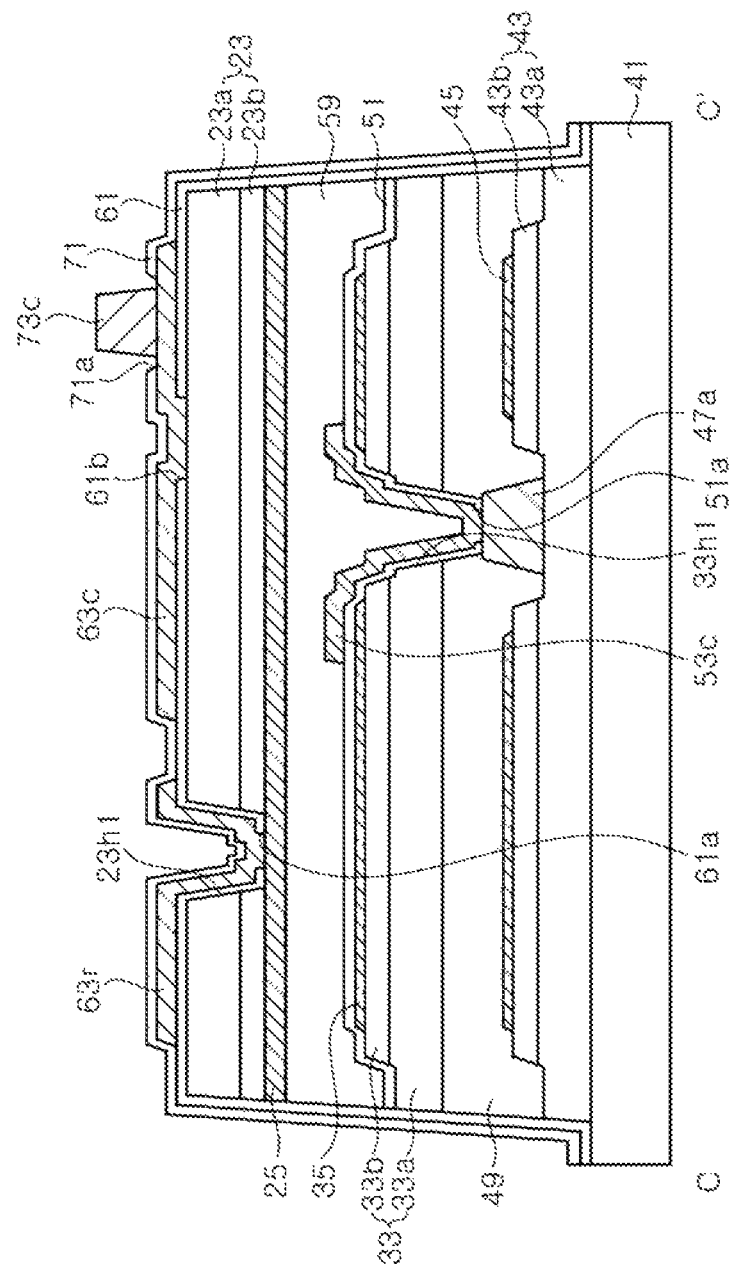

Referring to FIG. 15A, as described above, when the process of FIG. 13A, FIG. 13B, of FIG. 13C, and FIG. 13D are completed, the plurality of light emitting devices 100 are isolated from each other, and are arranged on the substrate 41 by the isolation trench.

Meanwhile, the circuit board 101 having pads on an upper surface thereof is provided. The pads are arranged on the circuit board 101 to correspond to locations where the pixels for a display are to be arranged. In general, an interval between the light emitting devices 100 arranged on the substrate 41 may be more dense than that of the pixels on the circuit board 101.

Referring to FIG. 15B, bump pads of the light emitting devices 100 are selectively bonded to the pads on the circuit board 101. The bump pads and the pads may be bonded using In bonding, for example. In this case, the light emitting devices 100 located between pixel regions may be spaced apart from the circuit board 101, since these light emitting devices 100 do not have pads of the circuit board 101 to be boned to.

Subsequently, a mask 201 is disposed on the substrate 41 and is irradiated with a laser. A light transmitting region of the mask 201 is disposed to correspond to the light emitting devices 100 bonded to the circuit board 101, and thus, the light emitting devices 100 bonded to the pads of the circuit board 101 are selectively irradiated with the laser. Thereafter, the light emitting devices 100 are transferred to the circuit board 101 by separating the light emitting devices 100 irradiated with the laser from the substrate 41. Accordingly, the display panel in which the light emitting devices 100 are arranged on the circuit board 101 is provided. The display panel may be mounted on various display apparatuses as described with reference to FIG. 1.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
a circuit board;
a plurality of light emitting units arranged on the circuit board, each light emitting unit comprising a first LED stack including:
a first conductivity type semiconductor layer;
a second conductivity type semiconductor layer;
a first electrode disposed on the first conductivity type semiconductor layer; and
a second electrode disposed on the second conductivity type semiconductor layer, the second electrode being transparent;
a plurality of bump pads disposed between the plurality of light emitting units and the circuit board; and
a bonding layer disposed between the second electrode and the circuit board,
wherein the second electrode has a side surface recessed inwardly with respect to a side surface of the light emitting unit to define a recessed portion, and the bonding layer is filled in the recessed portion.

2. The light emitting device for a display of claim 1, wherein each light emitting unit further comprises a second LED stack and a third LED stack, and the first, second, and third LED stacks are configured to emit one of red light, green light, and blue light, respectively.

3. The light emitting device for a display of claim 2, wherein:
the first, second, and third LED stacks are configured to be independently driven;
light generated from the first LED stack is configured to be emitted to the outside by passing through the second LED stack and the third LED stack; and
light generated from the second LED stack is configured to be emitted to the outside by passing through the third LED stack.

4. The light emitting device for a display of claim 1, wherein the bonding layer surrounds the second electrode and has a thickness greater than that of the second electrode.

5. The light emitting device for a display of claim 4, wherein at least a portion of the bonding layer is disposed further away from the circuit board than the second electrode.

6. The light emitting device for a display of claim 5, wherein at least a portion of the bonding layer is disposed further away from the circuit board than the second conductivity type semiconductor layer.

7. The light emitting device for a display of claim 1, wherein a first angle formed by the side surface of the second electrode and a top surface of the circuit board is different from a second angle formed by a side surface of the first conductivity type semiconductor layer and the top surface of the circuit board.

8. The light emitting device for a display of claim 7, wherein the first angle is greater than the second angle.

9. The light emitting device for a display of claim 1, further comprising an insulation layer covering side surfaces of the light emitting unit,
wherein the bonding layer contacts the insulation layer.

10. The light emitting device for a display of claim 1, wherein the bonding layer is transparent.

11. A light emitting device for a display, comprising:
a circuit board;
a plurality of light emitting units arranged on the circuit board, each light emitting unit comprising a first LED stack including:
a first conductivity type semiconductor layer;
a second conductivity type semiconductor layer;
an active layer disposed between the first and second conductivity type semiconductor layers and configured to generate light;
a first electrode disposed on the first conductivity type semiconductor layer; and
a second electrode disposed on the second conductivity type semiconductor layer;
a plurality of bump pads disposed between the plurality of light emitting units and the circuit board; and
a bonding layer disposed between the second electrode and the circuit board,
wherein the bonding layer is configured to transmit light generated from the active layer to the outside of the light emitting unit, and
wherein at least a portion of the bonding layer is disposed further away from the circuit board than the second electrode.

12. The light emitting device for a display of claim 11, wherein each light emitting unit further comprises a second LED stack and a third LED stack, and the first, second, and third LED stacks are configured to emit one of red light, green light, and blue light, respectively.

13. The light emitting device for a display of claim 11, wherein the bonding layer surrounds the second electrode and has a thickness greater than that of the second electrode.

14. The light emitting device for a display of claim 11, wherein a first angle formed by a side surface of the second electrode and a top surface of the circuit board is greater than a second angle formed by a side surface of the first conductivity type semiconductor layer and the top surface of the circuit board.

15. A light emitting device for a display, comprising:
a circuit board;
a plurality of light emitting units arranged on the circuit board, each light emitting unit comprising a first LED stack including:
a first conductivity type semiconductor layer;
a second conductivity type semiconductor layer;
a first electrode disposed on the first conductivity type semiconductor layer; and
a second electrode disposed on the second conductivity type semiconductor layer;
a plurality of bump pads disposed between the plurality of light emitting units and the circuit board; and
a bonding layer disposed between the second electrode and the circuit board,
wherein an interval between the light emitting units is greater than a width of the light emitting unit.

16. The light emitting device for a display of claim 15, wherein each light emitting unit further comprises a second LED stack and a third LED stack, and the first, second, and third LED stacks are configured to emit one of red light, green light, and blue light, respectively.

17. The light emitting device for a display of claim 15, wherein the bonding layer surrounds the second electrode and has a thickness greater than that of the second electrode.

18. The light emitting device for a display of claim 17, wherein at least a portion of the bonding layer is disposed further away from the circuit board than the second electrode.

19. The light emitting device for a display of claim 15, wherein a first angle formed by a side surface of the second electrode and a top surface of the circuit board is greater than a second angle formed by a side surface of the first conductivity type semiconductor layer and the top surface of the circuit board.

* * * * *